(12) United States Patent
Kim et al.

(10) Patent No.: US 12,223,898 B2
(45) Date of Patent: Feb. 11, 2025

(54) PIXEL CIRCUIT OPTIMIZING A CURRENT FLOW AND DISPLAY APPARATUS COMPRISING THE PIXEL CIRCUIT

(71) Applicant: LG Display Co., Ltd., Seoul (KR)

(72) Inventors: DaeKyu Kim, Gyeonggi-do (KR); DaeSung Jung, Gyeonggi-do (KR); JeongHo Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/202,064

(22) Filed: May 25, 2023

(65) Prior Publication Data

US 2023/0386407 A1 Nov. 30, 2023

(30) Foreign Application Priority Data

May 31, 2022 (KR) .......................... 10-2022-0066725

(51) Int. Cl.
*G09G 3/3233* (2016.01)
*H10K 59/121* (2023.01)
(Continued)

(52) U.S. Cl.
CPC ... *G09G 3/3233* (2013.01); *G09G 2300/0819* (2013.01); *G09G 2300/0842* (2013.01);
(Continued)

(58) Field of Classification Search
CPC ...... G05B 19/0428; G05B 2219/25205; G05B 2219/25428; G09G 2300/0819; G09G 2300/0842; G09G 2300/0861; G09G 2310/0202; G09G 2310/08; G09G 3/3233; H04L 9/0825; H04L 9/0838; H04L 9/085; H10K 2102/311; H10K 59/1213;
(Continued)

(56) References Cited

U.S. PATENT DOCUMENTS

2015/0049125 A1* 2/2015 Lee ...................... G09G 3/3233
345/77
2018/0114488 A1* 4/2018 Jung ..................... G09G 3/3258
(Continued)

FOREIGN PATENT DOCUMENTS

KR 10-2013-0055450 A 5/2013
KR 10-2018-0115205 A 10/2018

OTHER PUBLICATIONS

Office Action issued in corresponding Korean Patent Application No. 10-2022-0066725, dated Nov. 8, 2023.

*Primary Examiner* — Chun-Nan Lin
(74) *Attorney, Agent, or Firm* — Morgan, Lewis & Bockius LLP

(57) ABSTRACT

A pixel circuit can include a capacitor connected between a first node and a second node, a first transistor connected between a data line and the first node, a driving transistor including a gate electrode connected to the second node, a first electrode connected to a first voltage supply line, and a second electrode connected to a third node, a second transistor connected between the second node and a fourth node, the fourth node being connected to a reference voltage supply line, a third transistor connected between the fourth node and a fifth node, and an emission element connected to the driving transistor and connected to the third transistor through the fifth node.

20 Claims, 15 Drawing Sheets

(51) Int. Cl.
    *H10K 59/126*         (2023.01)
    *H10K 59/131*         (2023.01)
    *H10K 77/10*           (2023.01)
    *H10K 102/00*         (2023.01)

(52) U.S. Cl.
    CPC ............ *G09G 2300/0861* (2013.01); *G09G 2310/0202* (2013.01); *G09G 2310/08* (2013.01); *H10K 59/1213* (2023.02); *H10K 59/1216* (2023.02); *H10K 59/126* (2023.02); *H10K 59/131* (2023.02); *H10K 77/111* (2023.02); *H10K 2102/311* (2023.02)

(58) Field of Classification Search
    CPC ............. H10K 59/1216; H10K 59/126; H10K 59/131; H10K 77/111
    See application file for complete search history.

(56) References Cited

U.S. PATENT DOCUMENTS

| | | | | |
|---|---|---|---|---|
| 2018/0182289 A1* | 6/2018 | Jung | .................... | H10K 59/131 |
| 2019/0156708 A1* | 5/2019 | Li | ...................... | H10K 71/166 |
| 2019/0189052 A1* | 6/2019 | Moon | .................. | G09G 3/3266 |
| 2020/0234641 A1* | 7/2020 | Jeong | ................. | H10K 59/1216 |
| 2023/0230545 A1* | 7/2023 | Kim | .................... | G09G 3/3233 |
| | | | | 345/212 |

* cited by examiner

PIXEL CIRCUIT OPTIMIZING A CURRENT FLOW AND DISPLAY APPARATUS COMPRISING THE PIXEL CIRCUIT

CROSS-REFERENCE TO RELATED APPLICATION

This application claims the priority benefit of the Korean Patent Application No. 10-2022-0066725 filed on May 31, 2022, in the Republic of Korea, the entire contents of this Korean application being hereby expressly incorporated by reference into the present application.

BACKGROUND

Technical Field

The present disclosure relates to a pixel circuit capable of optimizing a current flow and a display apparatus comprising the pixel circuit.

Discussion of the Related Art

An organic light emitting diode OLED element, which is a self-luminous element, includes an anode electrode, a cathode electrode, and an organic compound layer formed between the anode electrode and the cathode electrode. The organic compound layer includes a hole transport layer HTL, an emission layer EML, and an electron transport layer ETL. When a driving voltage is applied to the anode electrode and the cathode electrode, holes are moved to the emission layer EML through the hole transport layer HTL and electrons are moved to the emission layer EML through the electron transport layer ETL, to thereby form an exciton. As a result, the emission layer EML generates visible rays. An active-matrix type organic light emitting display apparatus includes the organic light emitting diode OLED element which emits light by itself. The active-matrix type organic light emitting display apparatus has advantages of rapid response speed, high emission efficiency, high luminance, and wide viewing angle, whereby the active-matrix type organic light emitting display apparatus has been widely used in various ways.

In the organic light emitting display apparatus, respective pixels including organic light emitting elements can be arranged in a matrix configuration, and the luminance of the pixels can be adjusted according to a grayscale of video data.

Each of the pixels includes an organic light emitting element, a driving transistor for controlling a driving current flowing through the organic light emitting element according to a gate-to-source voltage, and at least one switching transistor for programming the gate-to-source voltage of the driving transistor.

In some cases, some pixel circuits can generate a short circuit of a line to which a high-potential voltage is applied and a line to which a reference voltage is applied in an initialization period. In this case, a display defect such as a horizontal stripe spot can be generated in the display apparatus. Therefore, a method for improving a display quality of the display apparatus is required.

SUMMARY

Accordingly, embodiments of the present disclosure are directed to a pixel circuit and a display apparatus comprising the pixel circuit that substantially obviate one or more of the problems due to limitations and disadvantages of the related art.

An aspect of the present disclosure is to provide a display apparatus for minimizing a display defect by changing a path of a current flow in an initialization period.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a pixel circuit may comprise a capacitor connected between a first node and a second node, a first transistor connected between a data line and the first node, a driving transistor including a gate electrode connected to the second node, a first electrode connected to a first voltage supply line, and a second electrode connected to a third node, a second transistor connected between the second node and a fourth node, the fourth node being connected to a reference voltage supply line, a third transistor connected between the fourth node and a fifth node, and an emission element connected to the driving transistor and connected to the third transistor through the fifth node.

In another aspect, a display apparatus may comprise a capacitor connected between a first node and a second node, a first transistor connected to a data line and the first node, a driving transistor including a gate electrode connected to the second node, a first electrode connected to a first voltage supply line, and a second electrode connected to a third node, a second transistor connected between the second node and a fourth node, a third transistor connected between the fourth node and a fifth node, the fourth node being connected to a reference voltage supply line, a fourth transistor connected between the third node and the fifth node, a fifth transistor connected between the second node and the third node, a sixth transistor connected between the first node and the reference voltage supply line, and an emission element connected between a fifth node and a second voltage supply line.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings.

DETAILED DESCRIPTION

Figure 1:
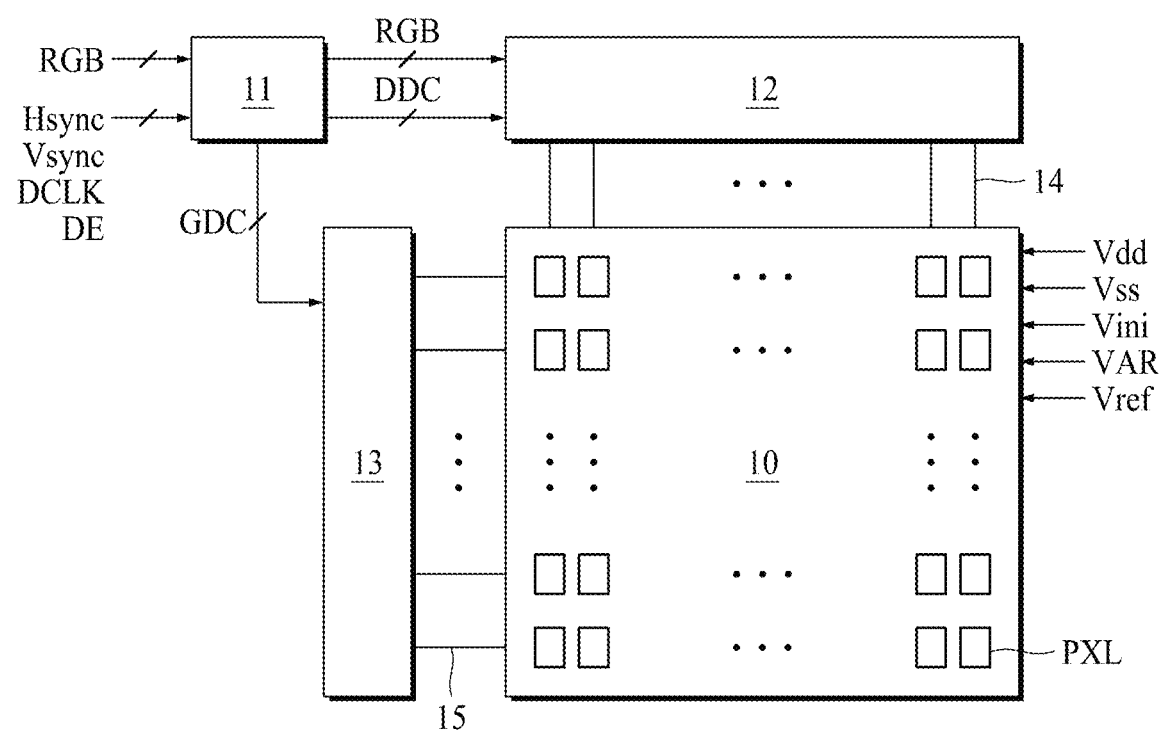
FIG. 1 is a block diagram of a display apparatus according to one embodiment of the present disclosure.

The term used in embodiments has been selected from general terms currently widely used with consideration for functionality in this disclosure, but it can vary depending on the intent or promotion of those skilled in the art, the appearance of new technology, etc. If needed, the applicant can arbitrarily select the specific term. In this case, the meaning of the term will be described in detail in the corresponding description. Therefore, the term used in the present disclosure should be defined based on the meaning of the term and the contents throughout the disclosure, instead of the simple name of term.

When a certain part of the entire disclosure includes a certain element, this means not to exclude other components unless otherwise stated, but can further include other components.

The expression "at least one of A, B, and C" described throughout the disclosure can encompass "A alone", "B alone", "C alone", "A and B", "A and C", "B and C", or "all of A, B, and C". The advantages and features of the present disclosure, and methods of achieving them will become apparent with reference to the embodiments described in detail below in conjunction with the accompanying drawings.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or may be briefly discussed.

In the case in which "comprise," "have", and "include" described in the present specification are used, another part can also be present unless "only" is used. The terms in a singular form can include plural forms unless noted to the contrary. In construing an element, the element is construed as including an error region although there is no explicit description thereof.

In describing a positional relationship, for example, when the positional order is described as "on," "above," "below," "beneath", and "next," etc., the case of no contact therebetween can be included, unless "direct" is used. For example, if it is mentioned that a first element is positioned "on" a second element, it does not mean that the first element is essentially or directly positioned above the second element in a figure.

It will be understood that, although the terms "first," "second," etc. can be used herein to describe various elements, these elements should not be limited by these terms. These terms are only used to distinguish one element from another and may not define any order or sequence. For example, a first element could be termed a second element, and, similarly, a second element could be termed a first element, without departing from the scope of the present disclosure.

The area, length, or thickness of each element described in the specification is illustrated for convenience of description, and the present disclosure is not necessarily limited to the area and thickness of the illustrated configuration.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

The terms to be described below are defined in consideration of the functions of the embodiments of the present specification and can be changed according to the intention of a user, an operator, or the like. Therefore, the definition should be made based on the contents throughout the specification.

A transistor included in a pixel circuit of the present disclosure can include at least one of an oxide thin film transistor Oxide TFT, an amorphous silicon a-Si TFT, and a low temperature polysilicon LTPS TFT.

The following embodiments are described with respect to an organic light emitting display apparatus. However, embodiments of the present disclosure are not limited to the organic light emitting display apparatus, and can be applied to other types of display apparatus, such as an inorganic light emitting display apparatus including an inorganic light emitting material. For example, embodiments of the present disclosure can be applied to a quantum dot display apparatus.

Terms such as "first", "second", and "third" are used to distinguish configurations for each embodiment, and the terms are not limited to these terms. Accordingly, even though the same terms are used, it can refer to other configurations according to the embodiments.

Hereinafter, embodiments of the present disclosure will be described with reference to the drawings. All components of each display apparatus according to all embodiments of the present disclosure are operatively coupled and configured.

FIG. 1 is a block diagram of a display apparatus according to one embodiment of the present disclosure.

An electroluminescent display apparatus can be applied to the display apparatus according to one embodiment of the present disclosure. The electroluminescent display apparatus can be an organic light emitting diode display apparatus, a quantum-dot light emitting diode display apparatus, or an inorganic light emitting diode display apparatus.

The display apparats according to one embodiment of the present disclosure can comprise a display panel 10 having subpixels PXL for internal compensation, a data driving circuit (or data driver) 12 configured to drive data lines 14, a gate driving circuit (or gate driver) 13 configured to drive gate lines 15, and a timing controller (T-con) 11 configured to control the driving timing of the data driving circuit 12 and the gate driving circuit 13. For example, the gate driving circuit 13 can be a first driving circuit, but not limited to the terms. For example, the data driving circuit 12 can be a second driving circuit, but not limited to the terms.

On the display panel 10, there are the plurality of data lines 14 and the plurality of gate lines 15 which intersect with each other, and the subpixels PXL for internal compensation are arranged in a matrix for each intersection area. The subpixel PXL can be arranged in the form of a matrix as shown, but not limited thereto. The subpixels PXL arranged in the same pixel row are connected to the plurality of gate lines 15, and the plurality of gate lines 15 can include at least one scan line and at least one emission control line.

For example, each subpixel PXL can be connected to one data line 14, at least one scan line, and emission control line. The subpixels PXL can receive a high-potential voltage Vdd, a low-potential voltage Vss, and a reference voltage Vref from a power generator in common. In order to prevent an unnecessary emission of an organic light emitting diode OLED in initialization and sampling sections, the reference voltage Vref can be within a voltage range sufficiently lower than an operation voltage of the OLED, and can be set to be equal to or lower than the low potential voltage Vss. For example, the high-potential voltage Vdd can be a first voltage, but not limited to the terms. For example, the low-potential voltage Vss can be a second voltage, but not limited to the terms. The subpixels PXL can further receive an initialization voltage Vini and a reset voltage VAR in common from the power generator.

Thin film transistors TFTs constituting the subpixel PXL can be implemented as an oxide transistor (or oxide TFT) including an oxide semiconductor layer. The oxide TFT can be advantageous for a large size of the display panel 10 in consideration of electron mobility, process variation, and the like. However, embodiments of the present disclosure are not limited thereto, and a semiconductor layer of the TFT can be formed of amorphous silicon, polysilicon, or the like.

Each subpixel PXL can include the plurality of TFTs and a storage capacitor to compensate for a threshold voltage Vth deviation of the driving TFT. A detailed configuration of each subpixel PXL will be described later.

In FIG. 1, a basic pixel can include at least three subpixels among white W, red R, green G, and blue B subpixels. For example, the basic pixel can be provided in combination of red R, green G, and blue B subpixels, combination of white W, red R, and green G subpixels, combination of blue B, white W, and red R subpixels, combination of green G, blue B, white W subpixels, or combination of white W, red R, green G, and blue B subpixels.

The timing controller 11 rearranges digital video data RGB inputted from the outside according to a resolution of the display panel 10 and supplies the rearranged digital video data to the data driving circuit 12. Also, the timing controller 11 can generate a data control signal DDC for controlling an operation timing of the data driving circuit 12 and a gate control signal GDC for controlling an operation timing of the gate driving circuit 13 based on timing signals such as a vertical synchronization signal Vsync, a horizontal synchronization signal Hsync, a dot clock signal DCLK, and a data enable signal DE The data driving circuit 12 converts the digital video data RGB inputted from the timing controller 11 into an analog data voltage based on the data control signal DDC and supplies the analog data voltage to the plurality of data lines 14.

The gate driving circuit 13 can generate scan signals Scan1 and Scan2 and emission signals (or emission control signals) EM on the basis of the gate control signal GDC. The gate driving circuit 13 can include a scan driver and an emission signal driver. The scan driver can generate the scan signal in a row sequential manner to drive at least one scan line connected to each pixel row and can supply the scan signal to the scan lines. The emission signal driver can generate the emission signal EM in a row sequential manner to drive at least one emission signal line connected to each pixel row and can supply the emission signal EM to the emission signal lines.

According to the embodiment, the gate driving circuit 13 can be embedded in a non-display area of the display panel 10 according to a gate driver-in-panel GIP method, but not limited thereto. If needed, the gate driving circuit 13 can be divided into plural portions, and the divided portions of the gate driving circuit 13 can be arranged on at least two side surfaces of the display panel 10, but not limited thereto.

Figure 2:
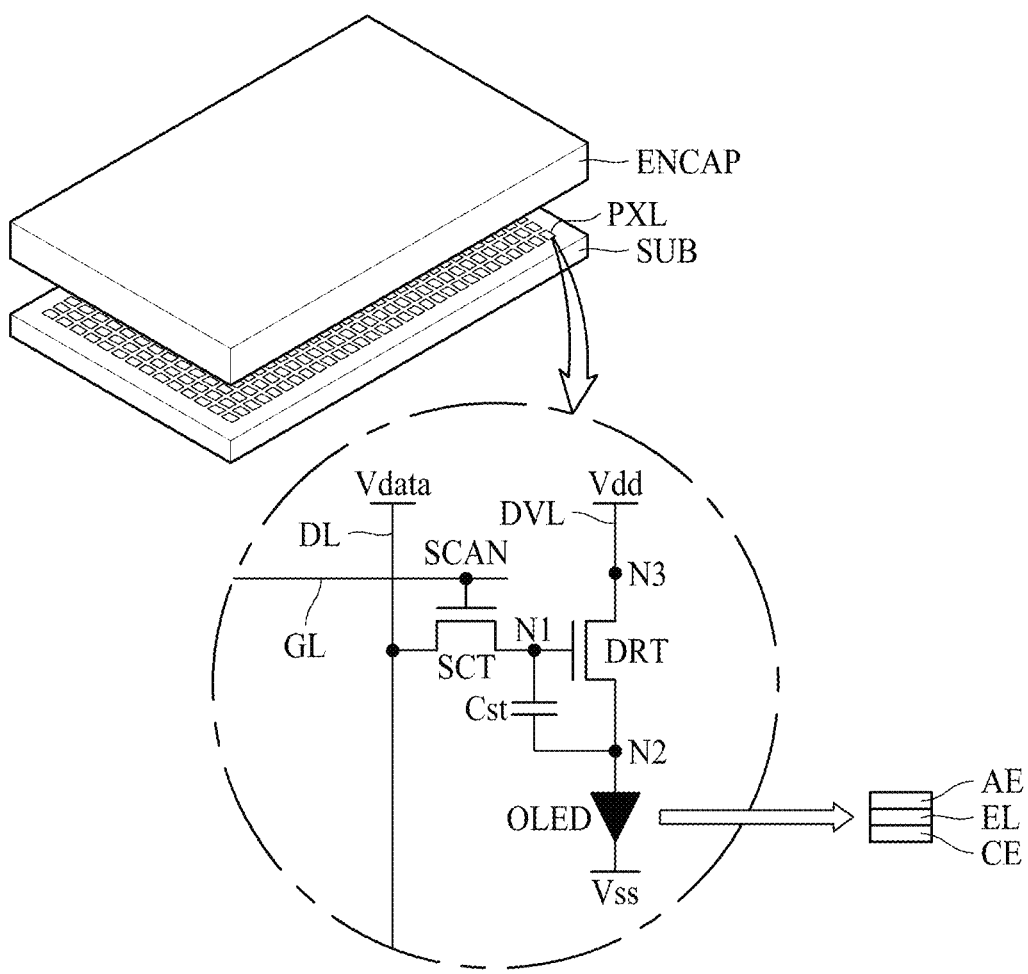
FIG. 2 illustrates a pixel circuit of the display apparatus according to one embodiment of the present disclosure.

FIG. 2 illustrates a pixel circuit of the display apparatus according to one embodiment of the present disclosure. FIG. 2 illustrates an example of a pixel circuit of the subpixel PXL of FIG. 1.

Referring to FIG. 2, each of the subpixels PXL disposed on a substrate SUB in a display area AA of a display panel 110 can include an emission element OLED, a driving transistor DRT for driving the emission element OLED, a scan transistor SCT for transferring a data voltage Vdata to a first node N1 of the driving transistor DRT, and a storage capacitor Cst for maintaining a predetermined voltage during one frame.

The driving transistor DRT includes the first node N1 to which the data voltage Vdata is applied, a second node N2 electrically connected to the emission element OLED, and a third node N3 to which a high-potential common voltage Vdd is applied from a driving voltage line DVL. In the driving transistor DRT, the first node N1 can be a gate node, the second node N2 can be a source node or a drain node, and the third node N3 can be a drain node or a source node.

The emission element OLED can include an anode electrode AE, an emission layer EL, and a cathode electrode CE. The anode electrode AE can be a pixel electrode disposed in each subpixel SP, and can be electrically connected to the second node N2 of the driving transistor DRT of each subpixel SP. The cathode electrode CE can be a common electrode commonly disposed in the plurality of subpixels PXL, and a low-potential common voltage VSS can be applied to the cathode electrode CE.

For example, the anode electrode AE can be the pixel electrode, and the cathode electrode CE can be the common electrode. On the contrary, the anode electrode AE can be the common electrode, and the cathode electrode CE can be the pixel electrode. Hereinafter, for convenience of description, it is assumed that the anode electrode AE is the pixel electrode, and the cathode electrode CE is the common electrode.

For example, the emission element OLED can be an organic light emitting diode, an inorganic light emitting diode, a quantum dot light emitting element, or the like. If the emission element OLED is the organic light emitting diode, an emission layer EL in the emission element OLED can include an organic emission layer including an organic material.

A turning-on/off state of the scan transistor SCT can be controlled by a scan signal SCAN which is a gate signal applied through the gate line GL. The scan transistor SCT can be configured to switch an electrical connection between the data line DL and the first node N1 of the driving transistor DRT.

The storage capacitor Cst can be electrically connected between the first node N1 and the second node N2 of the driving transistor DRT.

As shown in FIG. 2, each of the subpixel PXL can have a 2T(Transistor)1C(Capacitor) structure including two transistors DRT and SCT and one capacitor Cst. According to the embodiment, at least one subpixel can further include one or more transistors or can further include one or more capacitors.

The storage capacitor Cst is not a parasitic capacitor of an internal capacitor which can exist between the first node N1 and the second node N2 of the driving transistor DRT, but can be an external capacitor intentionally designed outside the driving transistor DRT.

Each of the driving transistor DRT and the scan transistor SCT can be an N-type transistor or a P-type transistor.

Since circuit elements (particularly, emission element OLED) in each subpixel SP are vulnerable to external moisture or oxygen, an encapsulation layer ENCAP for preventing external moisture or oxygen from penetrating into the circuit elements (particularly, emission element ED) can be disposed on a display panel (for example, display panel 10 of FIG. 1). The encapsulation layer ENCAP can be disposed to cover the emission elements OLED. For example, the encapsulation layer ENCAP can be disposed to completely cover the emission elements OLED.

Figure 3:
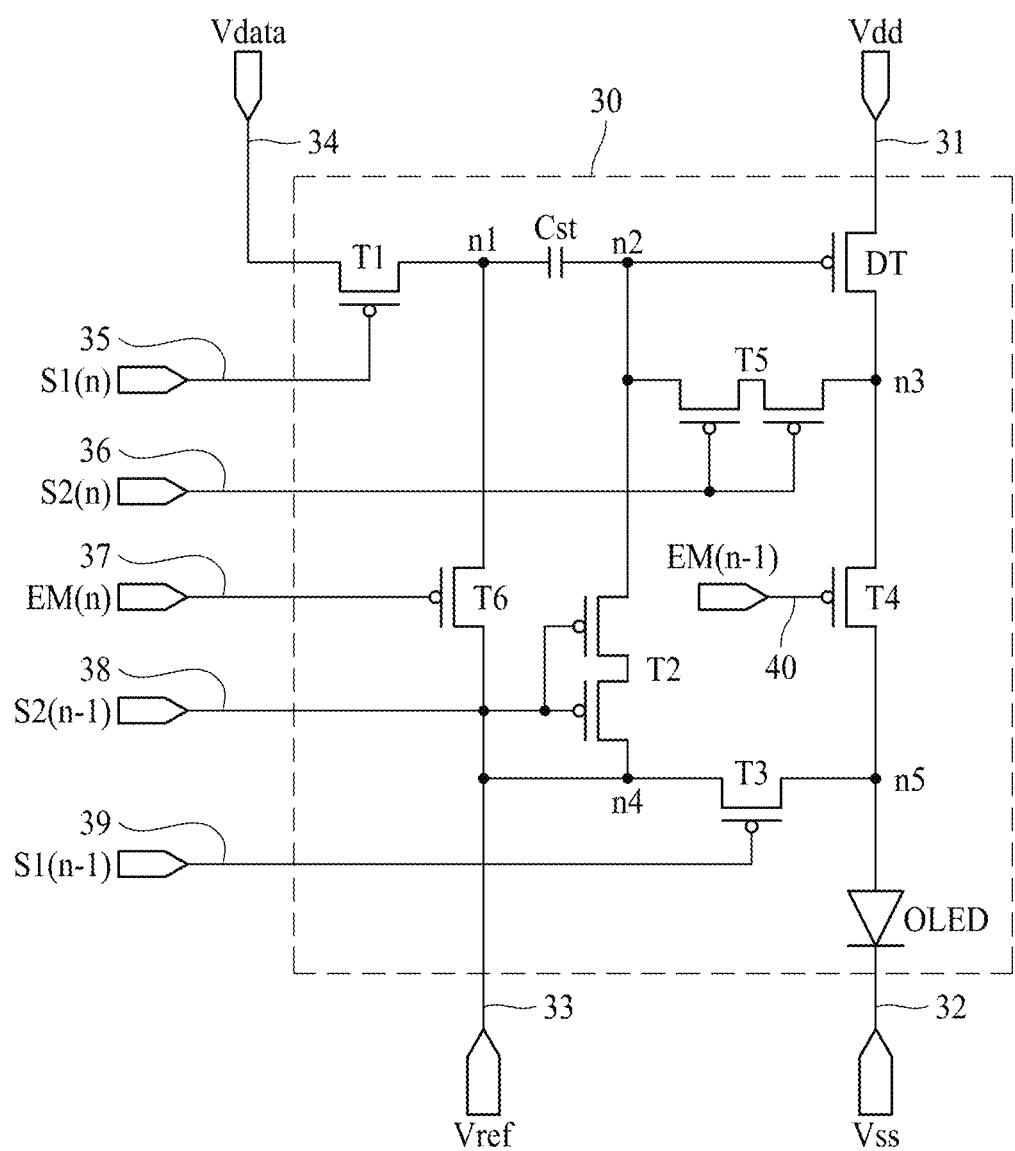
FIG. 3 illustrates an example of a pixel circuit in the display apparatus according to one embodiment of the present disclosure.

FIG. 3 illustrates an example of a pixel circuit of a display apparatus according to one embodiment of the present disclosure. A pixel circuit 30 of FIG. 3 can represent an equivalent circuit diagram of one subpixel (for example, subpixel PXL of FIG. 1). An equivalent circuit diagram of each subpixel included in a display panel (for example, display panel 10 of FIG. 1) can correspond to FIG. 3.

Referring to FIG. 3, the pixel circuit 30 can include seven TFTs (thin film transistors or transistors), one capacitor, and an emission element OLED. For example, the pixel circuit can include a driving TFT DT, a first TFT T1, a second TFT T2, a third TFT T3, a fourth TFT T4, a fifth TFT T5, a sixth TFT T6, a capacitor Cst, and an emission element OLED. A pixel structure as shown in FIG. 3 having seven TFTs and one capacitor can be represented by 7T1C, but not limited to these terms.

According to the embodiment, the pixel circuit 30 can include a plurality of capacitors. For example, the pixel circuit 30 can include a capacitor Cst and a second capacitor. The capacitor Cst can include a storage capacitor. The additional capacitor Cst can operate as an additional storage capacitor, but not limited thereto. For example, the additional capacitor Cst can operate as a component for more stably driving the pixel.

In the embodiment, the pixel circuit 30 can be connected to a high-potential voltage supply line (or first voltage supply line) 31 for supplying a high-potential voltage Vdd, a low-potential voltage supply line (or second voltage supply line) 32 for supplying a low-potential voltage Vss, a reference voltage supply line 33 for supplying a reference voltage Vref, and a data line 34 for supplying a data voltage Vdata. According to the embodiment, the high-potential voltage can be a first voltage, and the low-potential voltage can be a second voltage, but not limited thereto. In this case, the first voltage can have a value greater than the second voltage.

In the embodiment, a first scan signal and a second scan signal can be provided to the pixel circuit 30. The display panel includes (n+1) pixel rows (or rows) and (k) pixel columns (or columns), and pixel circuits can be arranged to correspond to point positions (for example, intersection points of the first pixel row and the first pixel column) of rows and columns. This arrangement can be a matrix arrangement, and specific examples of arrangements can refer to FIG. 1. However, in some cases, the number of rows arranged in at least some pixel columns can be different from the number of rows arranged in some other pixel columns. For example, when the display panel is implemented in various shapes, the arrangement of the pixel circuit can be performed according to the shape, and embodiments of the present disclosure are not limited thereto.

In the embodiment, the first scan signal and the second scan signal can be provided (or applied) to each pixel row of the display panel. For example, the first-supplied first scan signal and the first-suppled second scan signal can be provided to the first pixel row. In this manner, the (n)th first scan signal and the (n)th second scan signal can be provided to the (n)th pixel row. Accordingly, a line providing a first scan signal and a line providing a second scan signal which are matched (or mapped or correspond) can exist in each pixel row. For example, the (n)th pixel row can be matched with a first scan line 35 for providing the (n)th first scan signal and a second scan line 36 for providing the (n)th second scan signal.

According to the embodiment of the present disclosure, the pixel circuit 30 can be connected to a first scan line 35 for supplying the first scan signal S1(n) of the (n)th pixel row, a second scan line 36 for supplying the second scan signal S2(n) of the (n)th pixel row, a first emission signal line 37 for supplying an emission signal EM(n) of the (n)th pixel row, a third scan line 38 for supplying a second scan signal S2(n−1) of the (n−1)th pixel row, and a fourth scan line 39 for supplying a first scan signal S1(n−1) of the (n−1)th pixel row, where 'n' is a natural number.

Herein, the third scan line 38 can be mapped (or matched) to the (n−1)th pixel row, and the fourth scan line 39 can be mapped (or matched) to the (n)th pixel row.

Hereinafter, the present disclosure assumes that the (n)th pixel row is the pixel row in which the pixel circuit to be described is arranged. In this case, the (n−1)th pixel row corresponds to the previous (or immediately previous) pixel row.

In the present disclosure, for convenience of description, each of the first scan signal S1(n) of the (n)th pixel row, the second scan signal S2(n) of the (n)th pixel row, the second scan signal S2(n−1) of the (n−1)th pixel row, and the first scan signal S1(n−1) of the (n−1)th pixel row can be represented as the terms, for example, the first scan signal, the second scan signal, the third scan signal, and the fourth scan signal, respectively, but not limited thereto.

According to the embodiment of the present disclosure, the pixel circuit 30 can be connected to the emission signal EM(n) of the (n)th pixel row and an emission signal EM(n−1) of the (n−1)th pixel row. The pixel circuit 30 can be the pixel circuit arranged in the (n)th pixel row, as described above. The line supplied with the emission signal EM(n) of the (n)th pixel row can be the first emission signal line 37. The line supplied with the emission signal EM(n−1) of the (n−1)th pixel row can be a second emission signal line 40.

In the embodiment, the driving TFT DT is a transistor for driving the emission element OLED and can be a driving transistor. A first electrode of the driving TFT DT can be connected to the high-potential voltage supply line 31. A second electrode of the driving TFT DT can be connected to the third node n3. A gate electrode of the driving TFT DT can be connected to the second node n2.

The driving TFT DT can be turned-on or turned-off according to the voltage of the second node n2 and can be configured to supply the high-potential voltage Vdd supplied by the high-potential voltage supply line 31 to the third node n3 during the turn-on state.

The first electrode or second electrode of the driving TFT DT can correspond to a source electrode or a drain electrode. For example, the first electrode can correspond to the source electrode and the second electrode can correspond to the drain electrode. In another example, the second electrode can correspond to the source electrode and the first electrode can correspond to the drain electrode.

In the embodiment, one side of the first capacitor Cst can be connected to the gate electrode of the driving TFT DT. The other side of the capacitor Cst can be connected to the first TFT T1. According to FIG. 3, one side connected to the driving TFT DT of the capacitor Cst can be connected to the second node n2. The other side connected to the first TFT T1 of the capacitor Cst can be connected to the first node n1.

The capacitor Cst can include the storage capacitor. The storage capacitor can be configured to charge electrical energy (eg, charge, data voltage) to maintain a constant voltage during one frame. For example, when the application of the data voltage is stopped through the first TFT T1 during the driving process of the pixel circuit, the first capacitor Cst provides the stored electrical energy to the driving TFT DT to maintain the driving of the driving TFT DT during one frame.

According to the embodiment of the present disclosure, the first capacitor Cst can be composed of a parasitic capacitor corresponding to an internal capacitor, but not limited thereto. For example, the first capacitor Cst can be an external capacitor disposed outside the driving TFT DT.

In the embodiment, the first electrode of the first TFT T1 can be connected to the data line 34. The second electrode of the first TFT T1 can be connected to at least one of the capacitor Cst and the sixth TFT T6. For example, the second electrode of the first TFT T1 can be connected to the first electrode of the capacitor Cst and the sixth TFT T6.

The first electrode and the second electrode of the first TFT T1 can correspond to a source electrode or a drain electrode. For example, the first electrode can correspond to the source electrode and the second electrode can correspond to the drain electrode. Alternatively, the first electrode can correspond to the drain electrode and the second electrode can correspond to the source electrode. A first electrode and a second electrode in each TFT (for example, second TFT T2, third TFT T3, fourth TFT T4, fifth TFT T5, and sixth TFT T6) described to be later can likewise correspond to the source electrode or the drain electrode.

For another example, the drain electrode of the first TFT T1 can be connected to the data line 34. In this case, the source electrode of the first TFT T1 can be connected to the capacitor Cst.

The gate electrode of the first TFT T1 can be connected to the first scan line 35. The first scan signal S1(n) can be applied to the gate electrode of the first TFT T1 through the first scan line 35. The first TFT T1 can be turned-on or turned-off according to the first scan signal S1(n) applied through the first scan line 35 and can be configured to connect the first node n1 and the data line 34 during the turning-on state. In this case, the data voltage can be provided to the first node n1 through the data line 34.

The first electrode of the second TFT T2 can be connected to the second node n2. The first electrode of the second TFT T2 can be connected to at least one of the gate electrode, the capacitor Cst, and the fifth TFT T5 of the driving TFT DT. For example, the first electrode of the second TFT T2 can be connected to the gate electrode of the driving TFT DT, the capacitor Cst, and the first electrode of the fifth TFT T5. The second electrode of the second TFT T2 can be connected to the fourth node n4. The second electrode of the second TFT T2 can be connected to at least one of the third TFT T3, the reference voltage supply line 33, and the sixth TFT T6. For example, the second electrode of the second TFT T2 can be connected to the first electrode of the third TFT T3, the reference voltage supply line 33, and the second electrode of the sixth TFT T6.

The gate electrode of the second TFT T2 can be connected to the third scan line 38. The second TFT T2 can be turned-on or turned-off according to the second scan signal S2(n−1) of the (n−1)th pixel row applied through the third scan line 38. The second TFT T2 can connect the second node n2 and the fourth node n4 during the turning-on state.

In the embodiment, when the second TFT T2 is disposed between the gate electrode of the driving TFT DT and the reference voltage supply line 33, a path of an initial period (or initialization period) of the pixel circuit 30 can be held by the second TFT T2. A more detailed description related thereto can be made with reference to FIG. 5.

In another embodiment, the second TFT T2 can include a plurality of sub-transistors. In this case, the second TFT T2 can be a multi-transistor, a double transistor, or a dual transistor. For example, when the second TFT T2 is implemented to include the plurality of sub-transistors, the second TFT T2 can include two gates.

When the second TFT T2 includes the plurality of sub-transistors, a leakage current in the second TFT T2, and more particularly, a leakage current between the second node n2 and the reference voltage supply line 33 can be effectively reduced.

In the embodiment, the first electrode of the third TFT T3 is connected to the fourth node n4, and the second electrode can be connected to a fifth node n5. The first electrode of the third TFT T3 can be connected to at least one of the second TFT T2, the sixth TFT T6, and the reference voltage supply line 33. For example, the first electrode of the third TFT T3 can be connected to the second electrode of the second TFT T2, the second electrode of the sixth TFT T6, and the reference voltage supply line 33. The second electrode of the third TFT T3 can be connected to at least one of the fourth TFT T4 and the emission element OLED. For example, the second electrode of the third TFT T3 can be connected to at least one of the second electrode of the fourth TFT T4 and the emission element OLED.

In the embodiment, the third TFT T3 can be connected to the scan line for supplying the first scan signal S1(n−1) of the (n−1)th pixel row. For example, the gate electrode of the third TFT T3 can be connected to the fourth scan line 39. The first scan signal S1(n−1) of the (n−1)th pixel row can be applied to the gate electrode of the third TFT T3 through the fourth scan line 39. The third TFT T3 can be turned-on or turned-off according to the scan signal S1(n−1) applied through the fourth scan line 39, and can be configured to connect the fourth node n4 and the fifth node n5 during the turning-on state.

In the embodiment, the fourth scan line 39 can be further connected to the first TFT of the pixel circuit disposed in the (n−1)th pixel row. In this case, the first scan signal S1(n−1) of the (n−1)th pixel row can be provided to the first TFT of the pixel circuit disposed in the (n−1)th pixel row and the third TFT T3 of FIG. 3. More specific details related thereto will be described later.

In the embodiment, when the gate electrode of the third TFT T3 is connected to the fourth scan line 39 and the first scan signal S1(n−1) of the (n−1)th pixel row is supplied thereto, a load of the second scan signal S2(n) of the (n)th pixel row of the display apparatus can be reduced. Accordingly, the driving efficiency of the pixel circuit of the display apparatus can be improved.

In the embodiment, the first electrode of the fourth TFT T4 can be connected to the third node n3. The first electrode of the fourth TFT T4 can be connected to at least one of the fifth TFT T5 and the driving TFT DT. For example, the first electrode of the fourth TFT T4 can be connected to the second electrode of the fifth TFT T5 and the second electrode of the drive TFT DT. The second electrode of the fourth TFT T4 can be connected to the fifth node n5. The second electrode of the fourth TFT T4 can be connected to at least one of the third TFT T3 and the emission element OLED. For example, the second electrode of the fourth TFT T4 can be connected to the second electrode of the third TFT T3 and the emission element OLED.

The gate electrode of the fourth TFT T4 can be connected to the second emission signal line 40 for providing the emission signal EM(n−1) of the previous pixel row (or (n−1)th pixel row). The fourth TFT T4 can be turned-on or turned-off according to the emission signal EM(n−1) applied through the second emission signal line 40 and can be configured to connect the third node n3 and the fifth node n5 during the turning-on state.

In the embodiment, the first electrode of the fifth TFT T5 can be connected to the second node n2. The first electrode of the fifth TFT T5 can be connected to at least one of the gate electrode of the driving TFT DT, the capacitor Cst, and the second TFT T2. For example, the first electrode of the fifth TFT T5 can be connected to the gate electrode of the driving TFT DT, the capacitor Cst, and the first electrode of the second TFT T2. The second electrode of the fifth TFT T5 can be connected to the third node n3. The second electrode of the fifth TFT T5 can be connected to at least one of the driving TFT DT and the fourth TFT T4. For example, the second electrode of the fifth TFT T5 can be connected to the second electrode of the driving TFT DT and the first electrode of the fourth TFT T4.

The gate electrode of the fifth TFT T5 can be connected to the second scan line 36 for providing the second scan signal S2(n) of the (n)th pixel row. The fifth TFT T5 can be turned-on or turned-off according to the second scan signal S2(n) of the (n)th pixel row applied through the second scan line 36. The fifth TFT T5 can connect the second node n2 and the third node n3 during the turning-on state.

In another embodiment, the fifth TFT T5 can include the plurality of sub-transistors. In this case, the fifth TFT T5 can be a multi-transistor, a double transistor, or a dual transistor. For example, when the fifth TFT T5 is implemented to include the plurality of sub-transistors, the fifth TFT T5 can include two gates.

When the fifth TFT T5 includes the plurality of sub-transistors, a current leaking from the fifth TFT T5 can be effectively reduced.

In the embodiment, the first electrode of the sixth TFT T6 is connected to the first node N1, and the second electrode of the sixth TFT T6 can be connected to the fourth node n4. The first electrode of the sixth TFT T6 can be connected to at least one of the first TFT T1 and the capacitor Cst. For example, the first electrode of the sixth TFT T6 can be connected to the second electrode of the first TFT T1 and the capacitor Cst. The second electrode of the sixth TFT T6 can be connected to at least one of the third TFT T3 and the reference voltage supply line 33. For example, the first electrode of the sixth TFT T6 can be connected to the first electrode of the third TFT T3 and the reference voltage supply line 33.

The gate electrode of the sixth TFT T6 can be connected to the first emission signal line 37 for providing the emission signal EM(n) of the (n)th pixel row. The sixth TFT T6 can be turned-on or turned-off according to the emission signal EM(n−1) of the (n)th pixel row applied through the first emission signal line 37. The sixth TFT T6 can connect the first node n1 and the fourth node n4 during the turning-on state.

In the embodiment, the emission element OLED can be connected between the fifth node n5 and the low-potential voltage supply line 32. For example, the anode electrode of the emission element OLED can be connected to the fifth node N5, and the cathode electrode can be connected to the low-potential voltage supply line 32. Herein, the low-potential voltage supply line 32 can be a line for supplying the low-potential voltage Vss.

In the embodiment, one side of the emission element OLED can be connected to the third TFT T3 and the fourth TFT T4. The other side of the emission element OLED can be connected to the low-potential voltage supply line 32. The low-potential voltage supply line 32 can be referred to as a second voltage supply line according to the embodiment, but not limited to these terms. The voltage supplied through the low-potential voltage supply line 32 can be lower than the voltage supplied through the high-potential voltage supply line (or first voltage supply line) 31. For example, the voltage supplied through the low-potential voltage supply line 32 can include a ground voltage.

According to the embodiment, the emission element OLED can include at least one of an organic light emitting diode, an inorganic light emitting diode, and a quantum dot light emitting element. When the emission element OLED is the organic light emitting diode, the emission layer EL of the emission element OLED can include an organic emission layer EL including an organic material.

According to the embodiment of the present disclosure, TFTs included in the pixel circuit 30 can be a P-type transistor. For example, each of the driving TFT, the first TFT T1, the second TFT T2, the third TFT T3, the fourth TFT T4, the fifth TFT T5, and the sixth TFT T6 included in the pixel circuit 30 can be a P-type transistor. However, the present invention is not limited thereto, and at least one TFT can be implemented as an N-type transistor according to the embodiment.

In case of the P-type TFT, a low-level voltage of each driving signal can be a gate-on voltage for turning on the TFT, and a high-level voltage of each driving signal can be a gate-off voltage for turning off the TFTs. In case of the N-type TFT, a low-level voltage of each driving signal can be a gate-off voltage for turning off the TFT, and a high-level voltage of each driving signal can be a gate-on voltage for turning on the TFTs.

The low-level voltage can correspond to a predetermined voltage (or preset voltage) lower than the high-level voltage. The high-level voltage can correspond to a predetermined voltage (or preset voltage) higher than the low-level voltage.

According to the embodiment of the present disclosure, the low-level voltage can be a first voltage, and the high-level voltage can be a second voltage, but not limited thereto. In this case, the first voltage can be lower than the second voltage.

The driving period (or pixel circuit 30) of the pixel circuit 30 of the display apparatus can include an initial period (or initialization period), a sampling period, and an emission period. In this case, FIGS. 5 and 6 relate to the initial period, FIGS. 7 and 8 relate to the sampling period, and FIGS. 9 and 10 relate to the emission period. A description with reference to FIGS. 5 to 10 will be described later.

Additionally, the driving period of the pixel circuit 30 can further include a holding period. The holding period can be a period in which the driving of the pixel circuit 30 is maintained to be stopped for a specific time.

Figure 4:
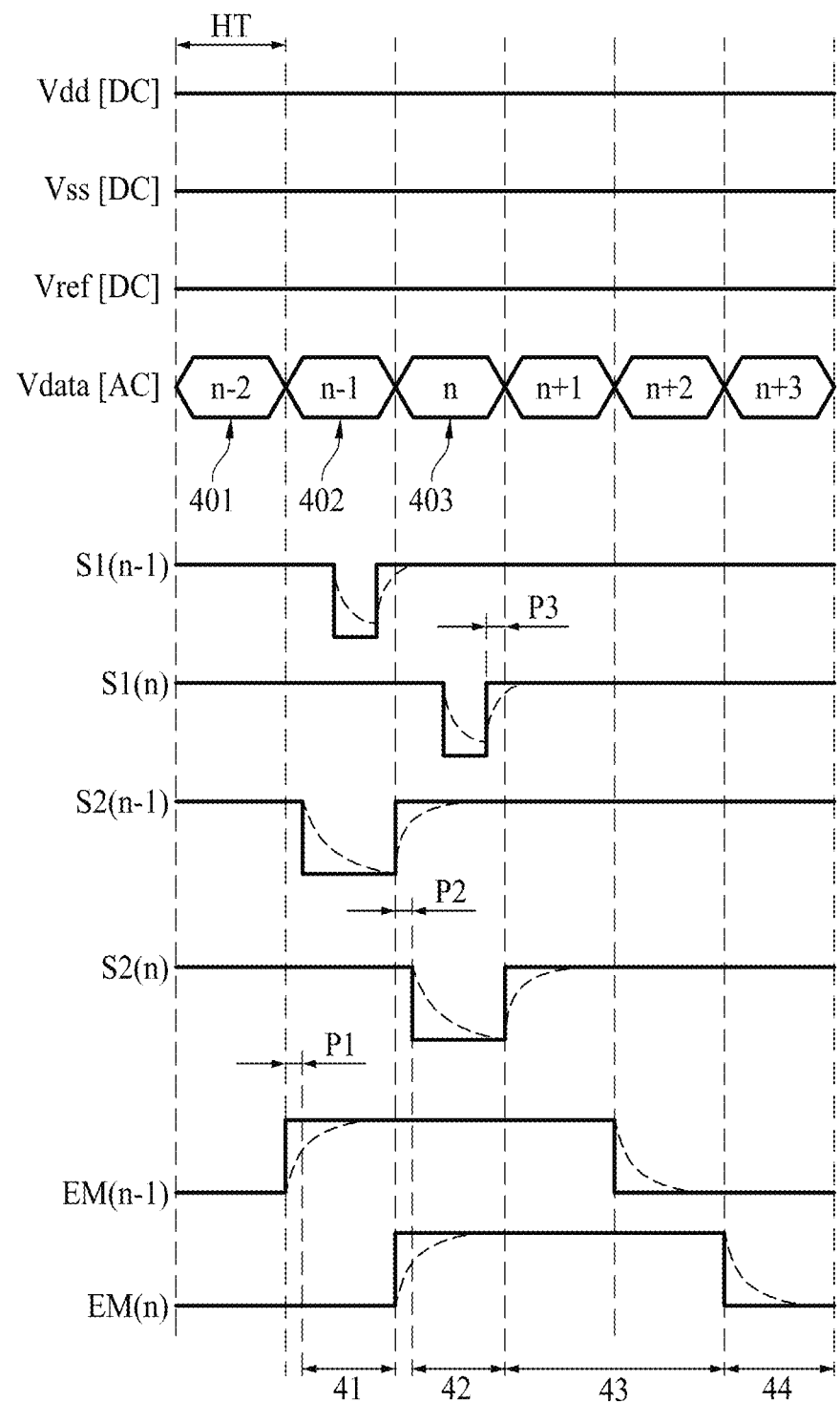
FIG. 4 illustrates the timing of signal related to the pixel circuit of the display apparatus according to one embodiment of the present disclosure.

FIG. 4 illustrates the timing of signal related to the pixel circuit of the display apparatus according to the embodiment of the present disclosure. FIG. 4 illustrates the signal applied to the pixel circuit of FIG. 3 and the driving period of the pixel circuit according to the state of the signal applied.

Referring to FIG. 4, the pixel circuit (for example, pixel circuit 30 of FIG. 3) can be supplied with the first voltage (or high-potential voltage) Vdd, the second voltage (or low-potential voltage) Vss, the reference voltage Vref, and the data voltage Vdata. The first voltage (or high-potential voltage) Vdd, the second voltage (or low-potential voltage) Vss, and the reference voltage Vref can be DC voltages (or direct current voltage), and the data voltage Vdata can be an AC voltage (or alternating current voltage).

In the embodiment, the first voltage Vdd can have a voltage value which is higher than the second voltage Vss and the reference voltage Vref. The second voltage Vss can be equal to or less than the reference voltage Vref. The data voltage Vdata can have a voltage value in a specific range. For example, the data voltage Vdata can have a value between 0 and 10V, but not limited thereto.

In the embodiment, a horizontal time HT can be a time interval in which one pixel row is turned-on and turned-off once. If the display panel includes five pixel rows, the time when the display panel is turned-on once can correspond to a time interval in which all five pixel rows are turned-on and turned-off once, for example, SHT. The time when the display panel is turned-on and turned-off once according to the embodiment can be one frame (1 frame), but not limited thereto. FIG. 4 illustrates the driving timing of the pixel circuit disposed in the (n)th pixel row, and the following description relates to the pixel circuit disposed in the (n)th pixel row.

Referring to FIG. 4, the data voltage Vdata can be sequentially applied to the pixel row in units of 1HT. The data voltage Vdata can be applied to the (n−2)th pixel row in the (n−2)th horizontal period 401. The data voltage Vdata can be applied to the (n−1)th pixel row in the (n−1)th horizontal period 402. The data voltage Vdata can be applied to the (n)th pixel row in the (n)th horizontal period 403.

The driving period of the pixel circuit can include an initial period 41, a sampling period 42, a holding period 43, and an emission period 44.

In the embodiment, the initial period 41 can be performed before supplying the data voltage Vdata. In the initial period 41, the first scan signal S1(n−1) of the (n−1)th (or previous) pixel row, the second scan signal S2(n−1) of the (n−1)th pixel row, and the emission signal EM(n) of the (n)th pixel row can be input as the low-level voltage. The first scan signal S1(n) of the (n)th pixel row, the second scan signal S2(n) of the (n)th pixel row, and the emission signal EM(n−1) of the (n−1)th pixel row can be input as the high-level voltage.

For example, according as the emission signal EM(n) of the (n)th pixel row is input as the high-level voltage, and the second scan signal S2(n−1) of the (n−1)th pixel row is input as the low-level voltage, the initial period 41 can start. The second scan signal S2(n−1) of the (n−1)th pixel row is input as the low-level voltage. After a specific time elapse, the first scan signal S1(n−1) of the (n−1)th pixel row can be input as the low-level voltage. The initial period 41 can be maintained while the second scan signal S2(n−1) of the (n−1)th pixel row is inputted as the low-level voltage.

Herein, the low-level voltage can be a voltage value smaller than the high-level voltage. The low-level voltage belongs to a voltage value range capable of turning-on the P-type TFT to which the low-level voltage is applied, or turning-off the N-type TFT to which the low-level voltage is applied, for example, a voltage in a range of −8V to −12V, but not limited thereto. The high-level voltage belongs to a voltage value range capable of turning-off the P-type TFT to which the high-level voltage is applied or turning-on the N-type TFT to which the high-level voltage is applied, for example, a voltage in a range of 6V to 16V, but not limited thereto.

In the embodiment, a pulse width of the first scan signal (for example, S1(n), S1(n−1)) can be narrower than a pulse width of the second scan signal (for example, S2(n), S2(n−1)), but not limited thereto. For example, the pulse width of the first scan signal (for example, S1(n), S1(n−1)) can be equal to or wider than the pulse width of the second scan signal (for example, S2(n), S2(n−1)).

In the embodiment, a rising time of the second scan signal S2(n−1) of the (n−1)th pixel row can correspond to a time point at which the initial period 41 ends or HT of the (n−1)th pixel row ends. A rising time of the first scan signal S1(n−1) of the (n−1)th pixel row can be earlier than the rising time of the second scan signal S2(n−1) of the (n−1)th pixel row.

In the embodiment, as shown in the drawings, after the first time P1 from the rising time of the (n−1)th emission signal EM(n−1), a falling time of the second scan signal S2(n−1) of the (n−1)th pixel row can occur. The initial period 41 can correspond to a period in which the second scan signal S2(n−1) of the (n−1)th pixel row is the low-level voltage. In this case, a rising time of the (n−1)th emission signal EM(n−1) can be advanced by the first time P1 than the time point when the initial period 41 starts.

Herein, the first time P1 can be a predetermined time period (or preset time period or preset period). The rising time can be the time point when the signal (for example, S1(n), S1(n−1), S2(n), S2(n−1), EM(n), EM(n−1)) is changed from the low-level voltage to the high-level voltage. The falling time can be the time point when the signal is changed from the high-level voltage to the low-level voltage.

In the embodiment, the sampling period 42 can be performed while the data voltage Vdata is supplied to the pixel circuit. In the sampling period 42, the first scan signal S1(n) of the (n)th pixel row and the second scan signal S2(n) of the (n)th pixel row can be input as the low-level voltage. The first scan signal S1(n−1) of the (n−1)th pixel row, the second scan signal S2(n−1) of the (n−1)th pixel row, the emission signal EM(n−1) of the (n−1)th pixel row, and the emission signal EM(n) of the (n)th pixel row can be input as the high-level voltage.

For example, according as the emission signal EM(n) of the (n)th pixel row is input as the high-level voltage, and the second scan signal S2(n) of the (n)th pixel row is input as the low-level voltage, the sampling period 42 can start. The second scan signal S2(n) of the (n)th pixel row is input as the low-level voltage. After a specific time elapse, the first scan signal S1(n) of the (n)th pixel row can be input as the low-level voltage. The timing at which the first scan signal S1(n) of the (n)th pixel row is input as the low-level voltage can be changed according to the pulse width change of the first scan signal and the second scan signal.

In the embodiment, a predetermined time (or preset time), for example, the second time P2 can exist between a time point when the second scan signal S2(n) of the (n)th pixel row is input from the high-level voltage to the low-level voltage and a time point when the emission signal EM(n) of the (n)th pixel row is input from the low-level voltage to the high-level voltage. For example, the second time P2 can be 0.3 μs (microsecond), but not limited thereto. It can be increased (for example, 5 μs or more) on the basis of a delay generated according to a horizontal length of the display panel. In this case, a time interval (or margin) for preventing a short circuit between the first voltage Vdd and the reference voltage Vref can be secured.

In the embodiment, the first scan signal of the (n)th pixel row can be changed from the low-level voltage to the high-level voltage at a time point which is advanced by the third time P3 than a time point at which the sampling period 42 ends (or when the second scan signal of the (n)th pixel row is changed from the low-level voltage to the high-level voltage). The rising time of the first scan signal S1(n) of the (n)th pixel row can be preceded by a predetermined time interval (or preset section), for example, the third time P3 than the rising time of the second scan signal S2(n) of the (n)th pixel row.

In the embodiment, the sampling period 42 can be maintained while the second scan signal S2(n) of the (n)th pixel row is the low-level voltage.

In the embodiment, the holding period 43 can be performed after the sampling period 42. The holding period 43 can be maintained from a time point when the second scan signal S2(n) of the (n)th pixel row is changed from the low-level voltage to the high-level voltage to a time point at which the emission signal EM(n) of the (n)th pixel row is changed from the high-level voltage to the low-level voltage.

In the holding period 43, the first scan signal S1(n−1) of the (n−1)th pixel row, the second scan signal S2(n−1) of the (n−1)th pixel row, the emission signal EM(n) of the (n)th pixel row, the first scan signal S1(n) of the (n)th pixel row, and the second scan signal S2(n) of the (n)th pixel row can be inputted as the high-level voltage. The emission signal EM(n−1) of the N1 th pixel row can be input as the high-level voltage and/or the low-level voltage. For example, in the holding period 43, the emission signal EM(n−1) of an (n−1)th pixel row can be input as the high-level voltage for 1HT, and then input as the low-level voltage for 1HT.

In the embodiment, in the holding period 43, there can be no change in the operation of the pixel circuit. For example, in the holding period 43, the state immediately after the sampling period 42 can be maintained constantly, such as that a voltage is not applied to the pixel circuit and is temporarily stopped.

In the embodiment, the emission period 44 can be performed after the sampling period 42 and/or the holding period 43. In the emission period 44, the first scan signal S1(n−1) of the (n−1)th pixel row, the second scan signal S2(n−1) of the (n−1)th pixel row, the first scan signal S1(n) of the (n)th pixel row, and the second scan signal S2(n) of the (n)th pixel row can be input as the high-level voltage. The emission signal EM(n) of the (n)th pixel row and the emission signal EM(n−1) of the (n−1)th pixel row can be input as the low-level voltage.

In the embodiment, a solid line pulse of FIG. 4 indicates an example in which a signal is applied, and a dotted line pulse indicates an example in which a delay of a signal is generated in a process of being applied to the pixel circuit. In other words, the first scan signal S1(n−1) and S1(n), the second scan signal S2(n−1) and S2(n), and the emission signal EM(n−1) and EM(n) are provided to the pixel circuit in the gate driving circuit in substantially the same form as the solid line pulse of FIG. 4, however, the delay can be generated in its providing process, whereby the signal can be applied to the pixel circuit in the form of the dotted line. This can be seen as an error range associated with the driving of the pixel circuit, which can be considered to be included in the scope of the embodiments herein. For example, even if the delay occurs while the signal is changed from the low-level voltage to the high-level voltage and the signal appears in the form such as the dotted line, the signal can be included in the scope of the present embodiment.

More specific details related to the initial period 41, the sampling period 42, and the emission period 44 can be referred to FIGS. 5 to 10 described below. In the following drawings, the same contents as those described above can be omitted.

Figure 5:
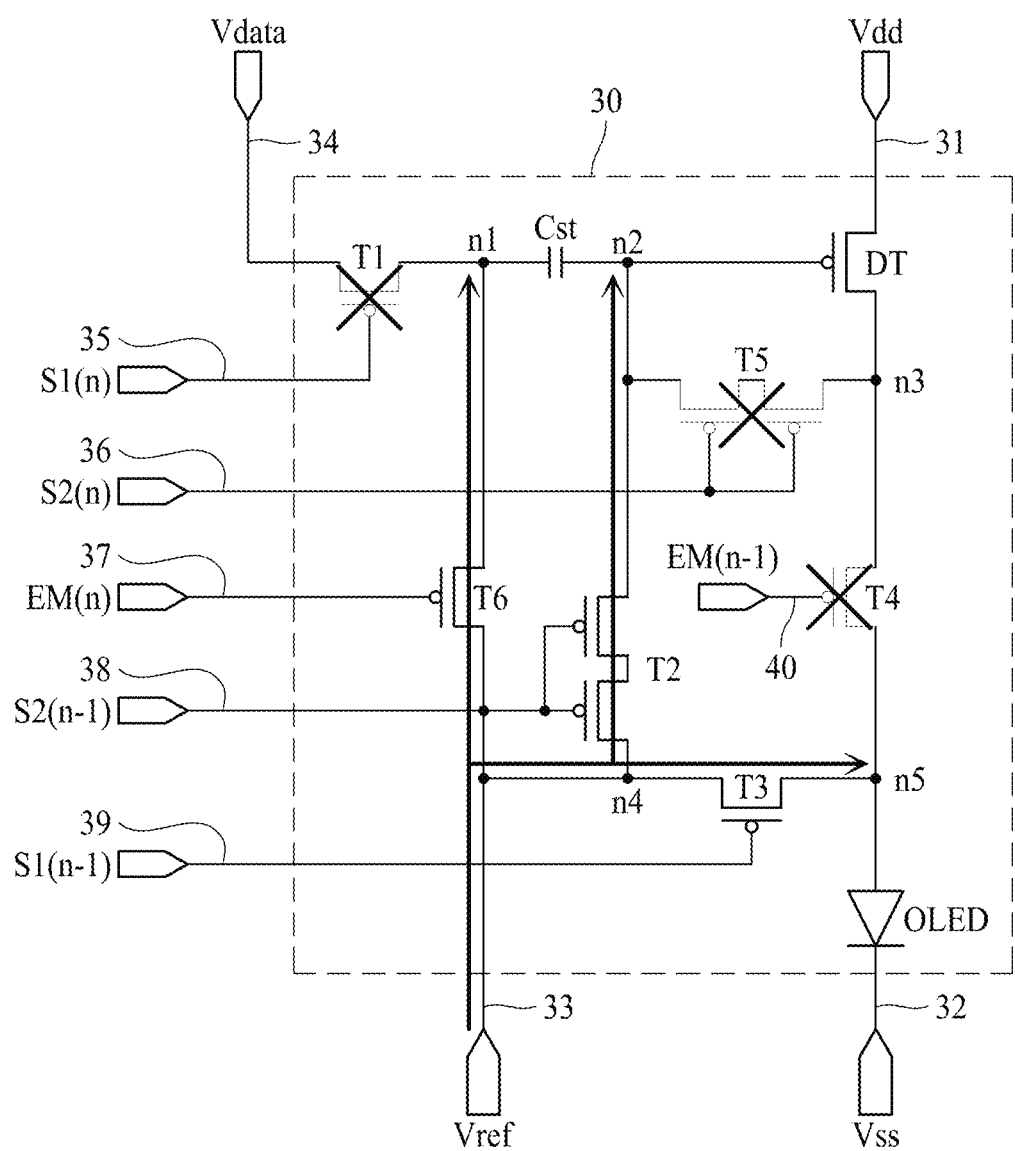
FIG. 5 illustrates driving of the pixel circuit in an initial period of the display apparatus according to one embodiment of the present disclosure.

FIG. 5 illustrates driving of the pixel circuit in the initial period of the display apparatus according to one embodiment of the present disclosure. For example, FIG. 5 illustrates an operation of the pixel circuit (for example, pixel circuit 30 of FIG. 3) in the initial period 41 of FIG. 4.

Referring to FIG. 5, in the initial period 41 of FIG. 4, the second TFT T2, the third TFT T3, and the sixth TFT T6 can be turned-on. The sixth TFT T6 is turned-on to initialize the first node n1 to the reference voltage Vref, and the third TFT T3 is turned-on to initialize the fifth node n5 to the reference voltage Vref. The anode electrode of the emission element OLED can be initialized to the reference voltage Vref.

According to the embodiment of the present disclosure, in the initial period, the second TFT T2 is turned-on so that the reference voltage Vref can be input to the gate electrode of the driving TFT DT. The reference voltage Vref can be operated as the initialization voltage for initializing the driving TFT DT. The first voltage Vdd can be input to the first electrode (or source electrode) of the driving TFT DT. In this case, the gate-source voltage of the driving TFT DT can correspond to the "reference voltage Vref-first voltage Vdd".

Figure 6:
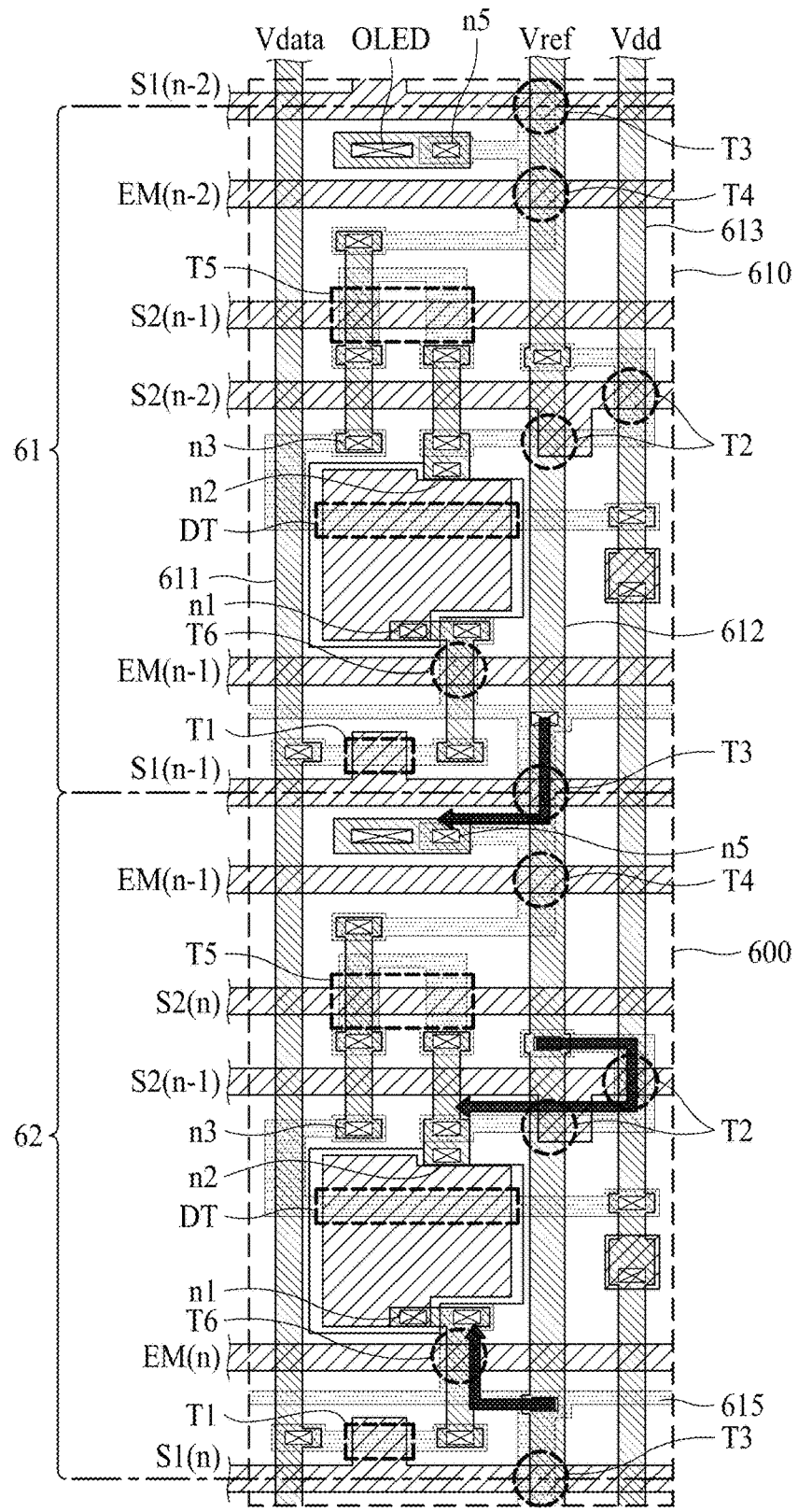
FIG. 6 illustrates a signal flow of the initial period of the display apparatus according to one embodiment of the present disclosure.

FIG. 6 illustrates a signal flow of the initial period of the display apparatus according to the embodiment of the present disclosure. For example, FIG. 6 shows a path in which a voltage is applied to the initial period on a plane of the pixel circuit, but not limited thereto. FIG. 6 shows various elements including a connection relationship of TFT on the plane of the pixel circuit (for example, a pixel circuit 600 of an n-stage 62, a pixel circuit 610 of an (n−1)-stage).

In the embodiment, pixel circuits 600 and 610 can include a data line 611 for supplying a data voltage Vdata, a reference voltage supply line 612 for supplying a reference voltage Vref, and a first voltage supply line 613 for supplying a high-potential voltage.

In the embodiment, a second voltage supply line for supplying a low-potential voltage can be connected to the emission element OLED (or cathode of the emission element), whereby the second voltage supply line can be disposed on an upper end of the emission element OLED. According to the embodiment, the second voltage supply line can be arranged in parallel with the data line 611, the reference voltage supply line 612, and/or the first voltage supply line 613, but not limited thereto.

In the embodiment, at least some of the data line 611, the reference voltage supply line 612, and the first voltage supply line 613 can be arranged in parallel. For example, as shown in the drawings, the data line 611, the reference voltage supply line 612, and the first voltage supply line 613 can be arranged in parallel.

In the embodiment, the reference voltage supply line 612 can be disposed between the first voltage supply line 613 and the data line 611. A distance between the reference voltage supply line 612 and the first voltage supply line 613 can be shorter than a distance between the reference voltage supply line 612 and the data line 611.

In one embodiment, the first TFT T1, the fifth TFT T5, the sixth TFT T6, and the drive TFT DT can be disposed in a region between the data line 611 and the reference voltage supply line 612. In another embodiment, at least one of the first TFT T1, the fifth TFT T5, the sixth TFT T6, and the driving TFT DT can be omitted or another TFT can be additionally disposed in a region between the reference voltage supply line 612 and the first voltage supply line 613.

The data line 611, the reference voltage supply line 612, and the first voltage supply line 613 can be made of the same or similar material as the source electrode or drain electrode (first electrode or second electrode) of the TFT (for example, first TFT T1~sixth TFT T6 and driving TFT DT). For example, the data line 611, the reference voltage supply line 612, and the first voltage supply line 613 can correspond to source and/or drain layer of the pixel circuit. In this case, at least a portion of the data line 131, the reference voltage supply line 132, and the first voltage supply line 133 can be disposed on the same layer as at least a portion of the source electrode and/or the drain electrode (first electrode or second electrode) of the TFT. A more specific example related thereto can be referred to in FIG. 14.

In the embodiment, at least some of the emission signal line and the scan line of the pixel circuit can be arranged in parallel with each other. For example, as shown in the drawings, the first scan line (for example, first scan line 35 of FIG. 3) for supplying the first scan signal S1(n) of the (n)th pixel row, the second scan line (for example, second scan line 36 of FIG. 3) for supplying the second scan signal S2(n) of the (n)th pixel row, the first emission signal line (for example, emission signal line 37 of FIG. 3) for supplying the emission signal EM(n) of the (n)th pixel row, the third scan line (for example, third scan line 38 of FIG. 3) for supplying the second scan signal S2(n−1) of the (n−1)th pixel row, and the fourth scan line (for example, fourth scan line 39 of FIG. 3) for supplying the first scan signal S1(n−1) of the (n−1)th pixel row can be arranged in parallel.

In the embodiment, the emission signal line and the scan line of the pixel circuit can be made of the same material as or similar material to the gate electrode of the TFT (for example, first to sixth TFTs T1 to T6 and driving TFT DT). For example, the emission signal line and the scan line of the pixel circuit can correspond to a gate layer of the pixel circuit. In this case, at least a portion of the emission signal line and the scan line can be disposed on the same layer as at least a portion of the gate electrode of the TFT. An example related thereto can be referred to in FIG. 14.

In the embodiment, an active layer 615 of the TFT can be disposed in the pixel circuit. At least a portion of the active layer 615 can form an active layer of the plurality of TFTs. For example, a portion of the active layer 615 can be configured by connecting an active layer of the third TFT T3 and the fourth TFT T4. Another portion of the active layer 615, for example, another portion separated from the active layer of the third TFT T3 and the fourth TFT T4, can form an active layer of the fifth TFT T5. However, this is merely an example, and the arrangement of the active layer 615 can be changed according to a design type.

In the embodiment, the active layer can be formed at a lower end (or lower side) than the layer of the emission line (or emission signal) and/or the scan line (or scan signal) corresponding to the gate electrode, and the layer of the data line 611, the reference voltage supply line 612, and the first voltage supply line 613. A more specific example thereof can be described with reference to FIG. 14.

Referring to FIG. 6, the scan line for supplying the (n−1)th first scan signal S1(n−1) can be connected to the first TFT T1 of the (n−1)th stage (or (n−1)th pixel row) 61 and the third TFT T T3 of the (n)th stage (or (n)th pixel row) 62. Accordingly, the (n−1)th first scan signal S1(n−1) can be supplied to the first TFT T1 of the (n−1)th stage 61 and the fifth TFT T5 of the (n)th stage 62.

In the embodiment, the first TFT T1 of the (n−1)th stage 61 can be disposed to correspond to the first TFT T1 of the (n)th stage 62. For example, even though the first TFT T1 of the (n−1)th stage 61 can be positioned differently from the first TFT T1 of the (n)th stage 62, they can be disposed at the same position with respect to one pixel circuit. For another example, in view of the function performed in the pixel circuit, the first TFT T1 of the (n−1)th stage 61 can be the same as the first TFT T1 of the (n)th stage 62.

According to the embodiment, the first TFT T1 of the (n−1)th stage 61 can be referred to as the seventh TFT (or seventh transistor) for distinction from the first TFT T1 of the (n)th stage 62, but not limited thereto.

In the embodiment, the (n−1)th stage 61 and the (n)th stage 62 can share the scan line for supplying the (n−1)th first scan signal S1(n−1). For example, the scan signal can be supplied to the TFTs arranged in the different pixel rows by one scan line. In this case, a circuit area can be reduced compared to a case in which the scan line for supplying the (n−1)th first scan signal S1(n−1) is arranged in each pixel row.

According to the embodiment, according as the (n−1)th stage 61 and the (n)th stage 62 share the scan line for supplying the (n−1)th first scan signal S1(n−1), a layout can be arranged (or configured) to overlap at least a portion of the scan line for supplying the (n−1)th first scan signal S1(n−1), as shown in FIG. 6.

In the embodiment, the (n)th stage 62 and the (n+1)th stage (not shown) can share the scan line for supplying the (n)th first scan signal S1(n). In this regard, it is substantially the same as an example of sharing the scan line for supplying the (n−1)th first scan signal S1(n−1), whereby a detailed description thereof will be omitted.

Referring to FIG. 6, in the initial period (for example, initial period 41 of FIG. 4), the second TFT T2, the third TFT T3, and the sixth TFT T6 of the pixel circuit (eg, pixel circuit 30 of FIG. 3) disposed in the (n)th stage 62 can operate in the ON state. In this case, the first and second electrodes (or source and drain electrodes) of the second TFT T2 can be connected, and the first and second electrodes (or source and drain electrodes) of the fifth TFT T5 can be connected. In addition, the first and second electrodes in each of the second TFT T2, the third TFT T3, and the sixth TFT T6 are connected, as shown in the drawings, whereby the voltage can be applied (or current can flow) through the second TFT T2, the third TFT T3, and the sixth TFT T6.

When the pixel circuit 600 of the (n)th stage 62 operates in the initial period, the pixel circuit 610 of the (n−1)th stage 61 can perform an operation advanced by 1HT than the pixel circuit 600 of the (n)th stage 62. For example, when the pixel circuit 600 of the (n)th stage 62 operates in the initial period, the pixel circuit 610 of the (n−1)th stage 61 can perform an operation of the sampling period. The operation of the sampling period will be described with reference to FIGS. 7 and 8.

Figure 7:
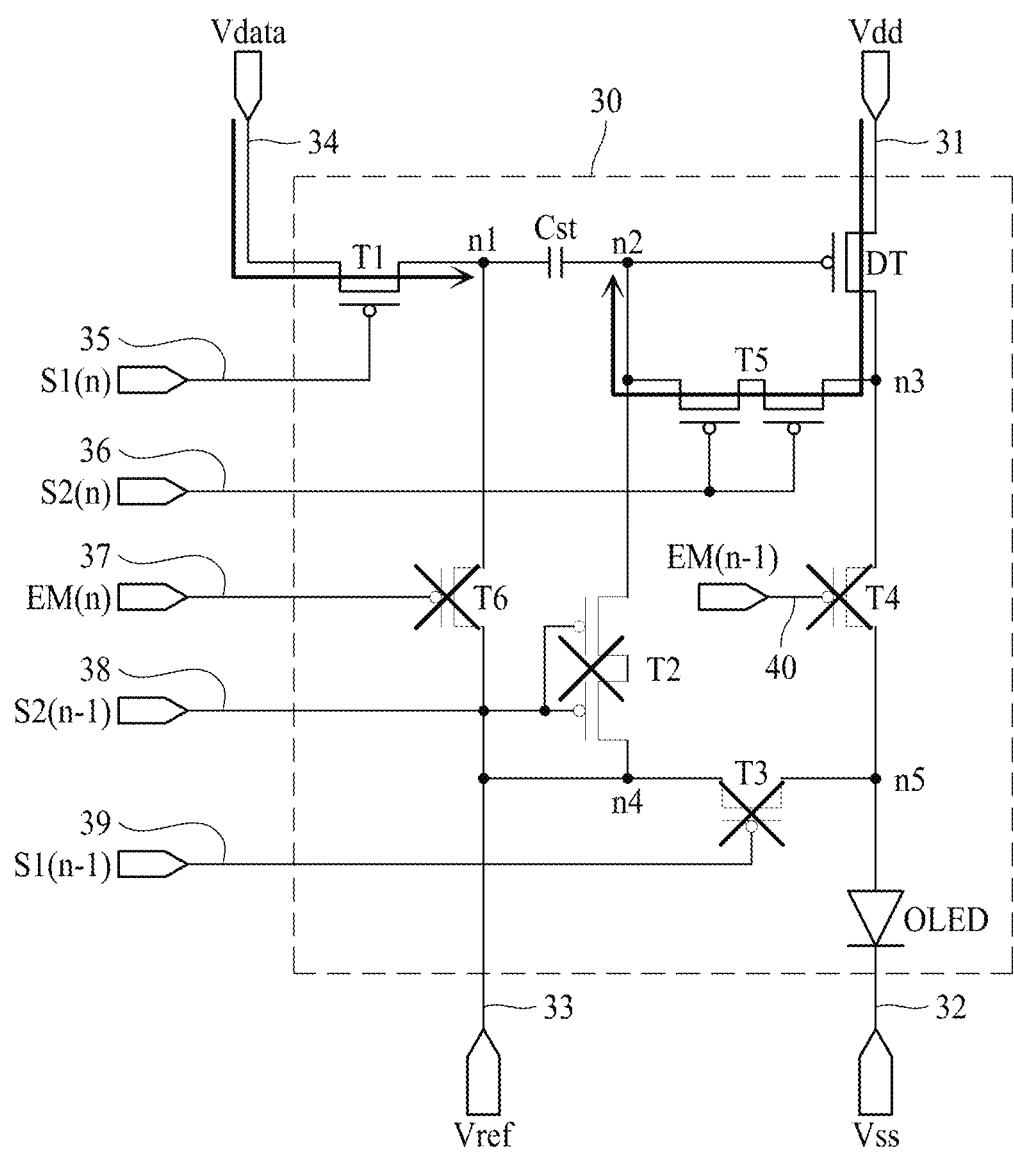
FIG. 7 illustrates driving of the pixel circuit in a sampling period of the display apparatus according to one embodiment of the present disclosure.

FIG. 7 illustrates driving of the pixel circuit in the sampling period of the display apparatus according to one embodiment of the present disclosure. Hereinafter, the same contents as those of FIGS. 5 and 6 will be omitted.

Referring to FIG. 7, in the sampling period (eg, sampling period 42 of FIG. 4), the first TFT T1 of the (n)th pixel row (or (n)th stage) 62 can be turned-on by the first scan signal S1(n), and the fifth TFT T5 can be turned-on by the second scan signal S2(n). In this case, the data voltage Vdata can be charged in the capacitor Cst.

In the embodiment, a voltage of "Vdd+Vth" level corresponding to a sum of the high-potential voltage Vdd and threshold voltage Vth of the driving TFT DT can be charged in the second node n2 by the fifth TFT T5 during the sampling period.

According to the embodiment of the present disclosure, in the sampling period, a voltage corresponding to a sum of the high-potential voltage Vdd and threshold voltage, that is, a voltage of "Vdd+Vth" in which the compensation of the threshold voltage Vth is completed can be applied (or input) to the gate electrode of the driving TFT DT. The high-potential voltage Vdd can be applied to the source electrode of the driving TFT DT. In this case, the gate-source voltage of the driving TFT DT can correspond to the threshold voltage Vth.

In the sampling period, the data voltage Vdata can be supplied to the first node n1 through the first TFT T1. The capacitor Cst can charge a voltage difference between the voltage of the first node n1 and the voltage of the second node n2. Accordingly, when the data voltage Vdata is applied to the first node n1 in the sampling period and the compensation of the threshold voltage Vth of the driving TFT DT is completed in the second node n2, the data voltage "Vdd+Vth−Vdata" in which the compensation of the threshold voltage Vth is completed can be applied to the gate electrode of the driving TFT DT.

According to the embodiment, the threshold voltage Vth of the driving TFT DT can be changed. Through the operation in the sampling period, for example, the sampling operation, the driving TFT DT of each of the subpixels included in the display panel can sample the gate-to-source voltage Vgs in which the threshold voltage Vth is compensated and can set the sampled gate-source voltage Vgs as the driving voltage. Thus, the pixel circuit can supply a current corresponding to the data voltage Vdata to the emission element OLED without being affected by the variable threshold voltage Vth of the driving TFT DT. Accordingly, the emission element OLED can have the emission characteristic corresponding to the data voltage Vdata without the influence of the threshold voltage Vth of the driving TFT DT.

Figure 8:
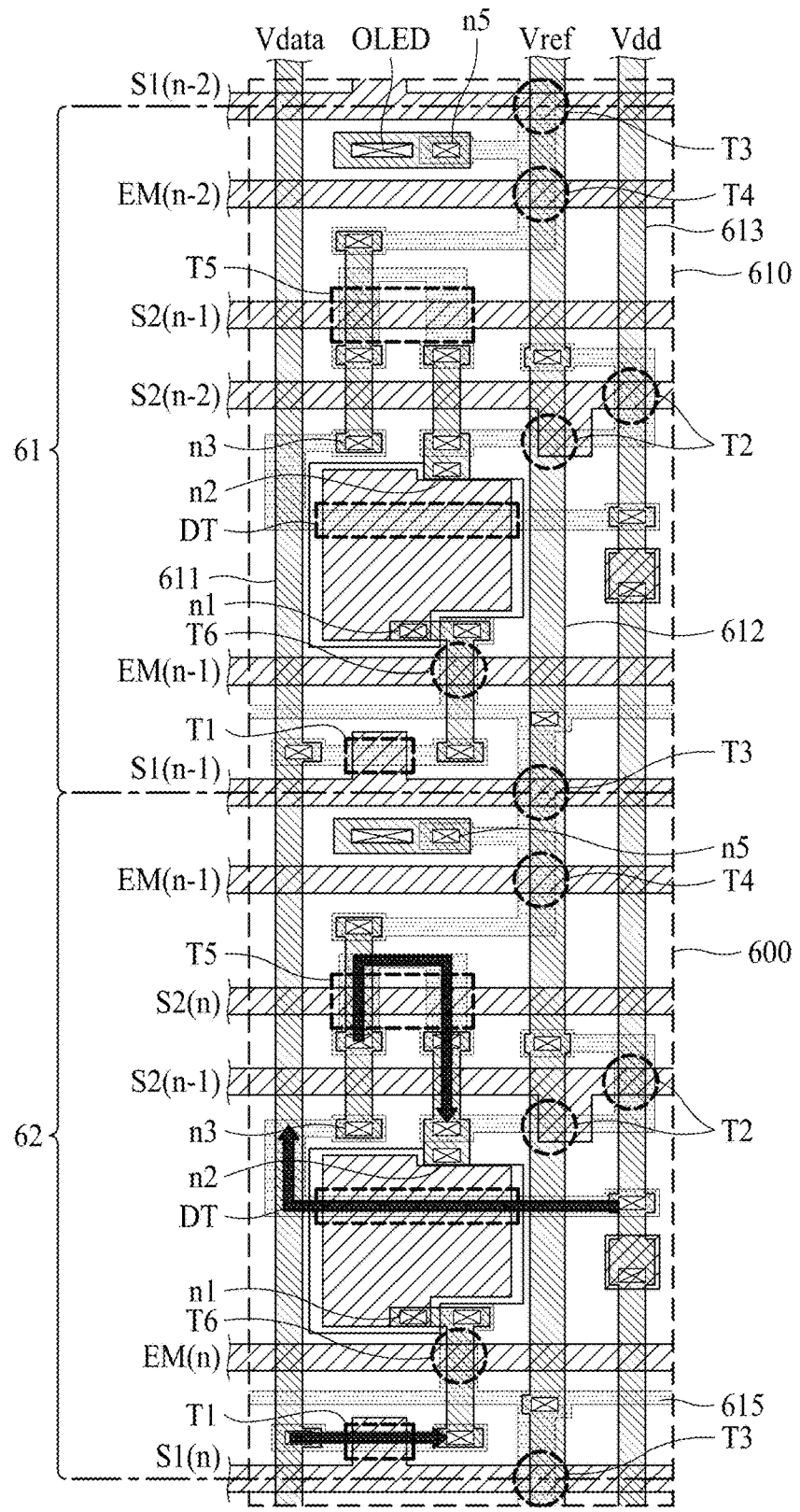
FIG. 8 illustrates a signal flow in the sampling period of the display apparatus according to one embodiment of the present disclosure.

FIG. 8 illustrates a signal flow in the sampling period of the display apparatus according to the embodiment of the present disclosure.

Referring to FIG. 8, the first TFT T1 and the fifth TFT T5 of the pixel circuit 600 disposed in the (n)th stage 62 in the sampling period can operate in the ON state. In this case, the first and second electrodes (or source and drain electrodes) of the first TFT T1 can be connected, and the first and second electrodes (or source and drain electrodes) of the fifth TFT T5 can be connected. In addition, the first and second electrodes in each of the first TFT T1 and the fifth TFT T5 are connected, as shown in the drawings, whereby the voltage can be applied (or current can flow) through the first TFT T1 and the fifth TFT T5.

When the pixel circuit 600 of the (n)th stage 62 operates in the sampling period, the pixel circuit 610 of the (n−1)th stage 61 can perform an operation advanced by 1HT than the pixel circuit 600 of the (n)th stage 62. For example, when the pixel circuit 600 of the (n)th stage 62 operates in the sampling period, the pixel circuit 610 of the (n−1)th stage 61 can perform an operation of the holding period. The holding period can be the period in which the state pf the pixel circuit (for example, state of the pixel circuit 610), for example, the voltage (or preset voltage value) set after the sampling operation, that is, the gate-source voltage Vgs of the driving TFT DT is held (or paused).

According to the embodiment, in the holding period, the pixel circuit can be maintained in the constant state. For example, all the first to sixth TFTs T1 to T6 can maintain the OFF state. For another example, in at least a portion of the holding period, the fourth TFT T4 can be turned-on, but the first TFT T1, the second TFT T2, the third TFT T3, the fifth TFT T5, and the sixth TFT T6 can be turned-off. The holding period can be maintained from a time point when the sampling period ends to a time point when the emission period starts.

Figure 9:
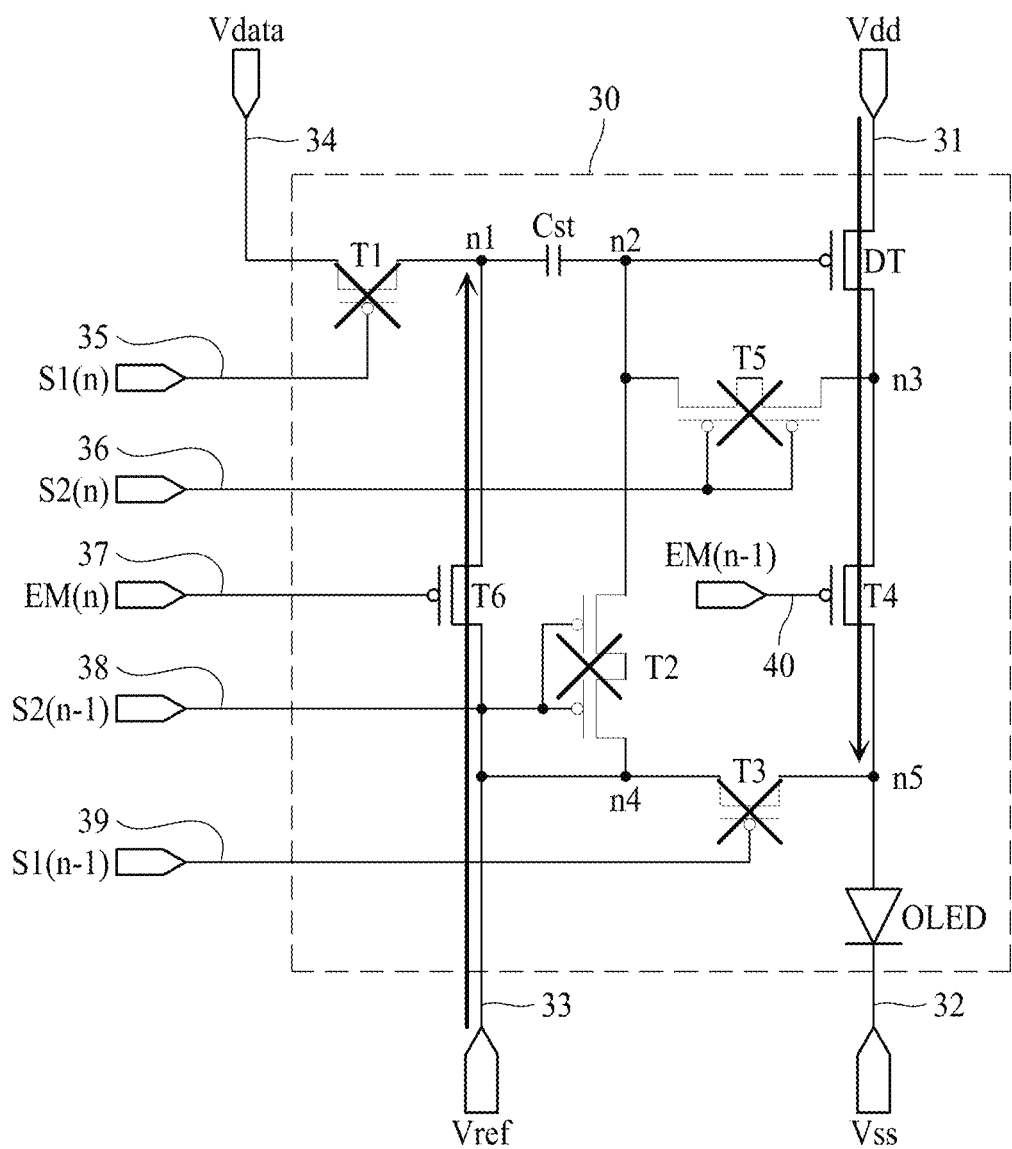
FIG. 9 illustrates driving of the pixel circuit in an emission period of the display apparatus according to one embodiment of the present disclosure.

FIG. 9 illustrates driving of the pixel circuit in the emission period of the display apparatus according to one embodiment of the present disclosure. For example, FIG. 9 illustrates an operation of the pixel circuit (eg, pixel circuit 30 of FIG. 3) in the emission period 44 of FIG. 4.

Referring to FIG. 9, the fourth TFT T4 and the fifth TFT T5 are turned-on in the emission period, and the first TFT T1 to third TFT T3 and the sixth TFT T6 can be turned-off. In addition, the driving TFT DT can be turned-on in the emission period. According as the fourth TFT T4 is turned-on, the OLED driving voltage corresponding to the voltage stored in the capacitor Cst can be supplied to the emission element OLED. The emission element OLED can emit light in response to the supply of the OLED driving voltage.

According to the embodiment of the present disclosure, when the reference voltage Vref is applied to the first node n1 through the sixth TFT T6 in the emission period, the voltage of the first node n1 can be changed to "Vdata−Vvref", and the varied voltage "Vdata−Vvref" can be applied to the second node n2 by coupling of the capacitor Cst. Accordingly, "Vdd+Vth+(Vref−Vdata)" can be applied to the gate electrode of the driving TFT DT in the emission period. The first voltage Vdd can be applied to the source electrode of the driving TFT DT. In this case, the gate-source voltage Vgs of the driving TFT DT can be determined as "Vth+(Vref−Vdata)". Therefore, the driving TFT DT can generate the current proportional to "Vref−Vdata" without the influence of the threshold voltage Vth and can supply the current to the emission element OLED through the fourth TFT T4.

Figure 10:
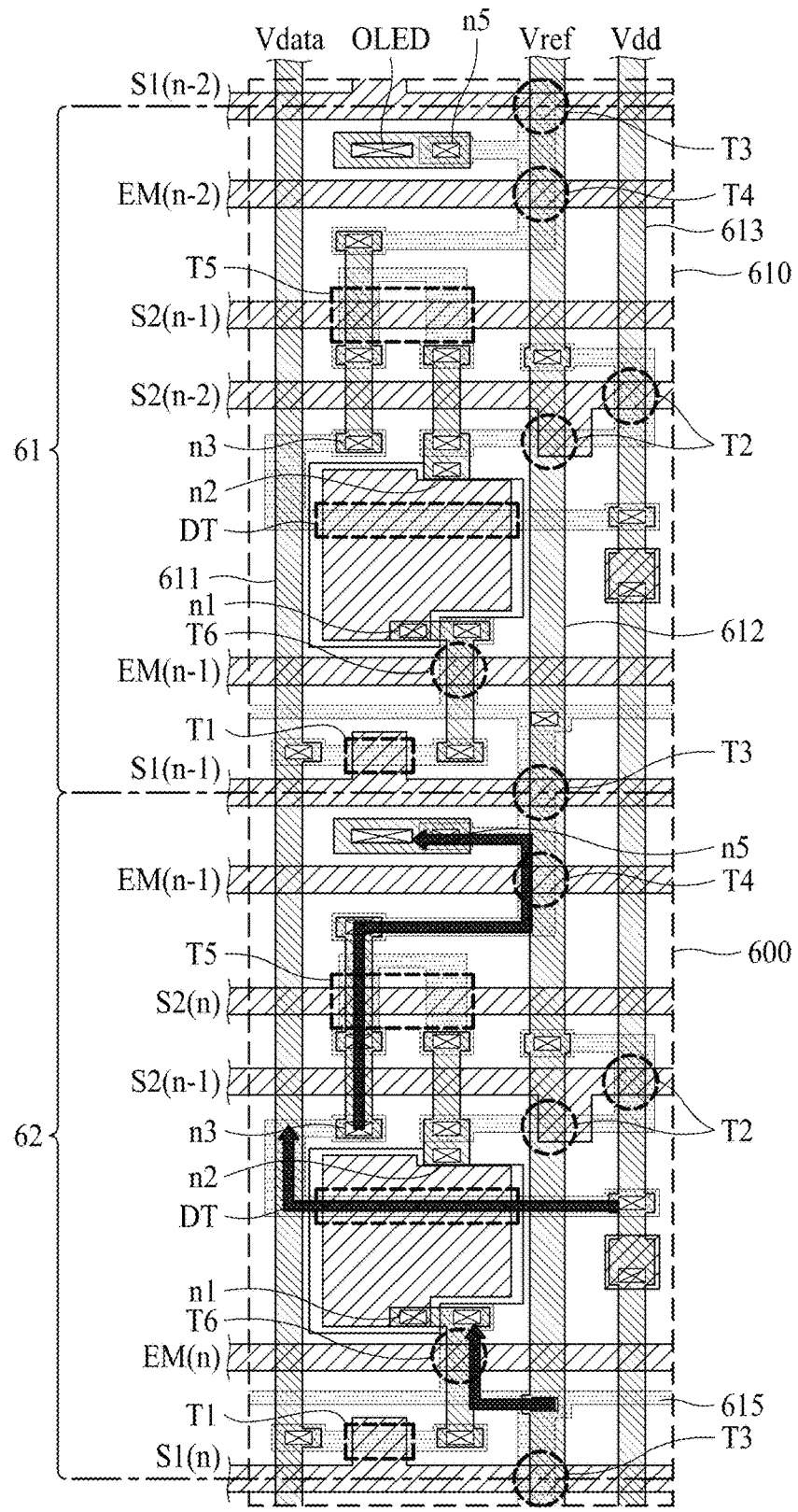
FIG. 10 illustrates a signal flow in the emission period of the display apparatus according to one embodiment of the present disclosure.

FIG. 10 illustrates a signal flow in the emission period of the display apparatus according to one embodiment of the present disclosure. For example, FIG. 10 shows a path in which a voltage is applied to the emission period on a plane of the pixel circuit.

Referring to FIG. 10, in the emission period (for example, emission period 44 of FIG. 4), the fourth TFT T4 and the sixth TFT T6 of the pixel circuit (eg, the pixel circuit 30 of FIG. 3) disposed in the (n)th stage 62 can operate in the ON state. In this case, the first and second electrodes (or source and drain electrodes) of the fourth TFT T4 can be connected, and the first and second electrodes (or source and drain electrodes) of the sixth TFT T6 can be connected. In addition, the first and second electrodes in each of the fourth TFT T4 and the sixth TFT T6 are connected, as shown in the drawings, whereby the voltage can be applied (or current can flow) through the fourth TFT T4 and the sixth TFT T6.

In the embodiment, as the voltage is supplied to the emission element OLED in the emission section, the emission element OLED can emit light.

Hereinafter, redundant descriptions of the pixel circuit (for example, pixel circuit of FIGS. 3 to 10) described above can be omitted.

Figure 11:
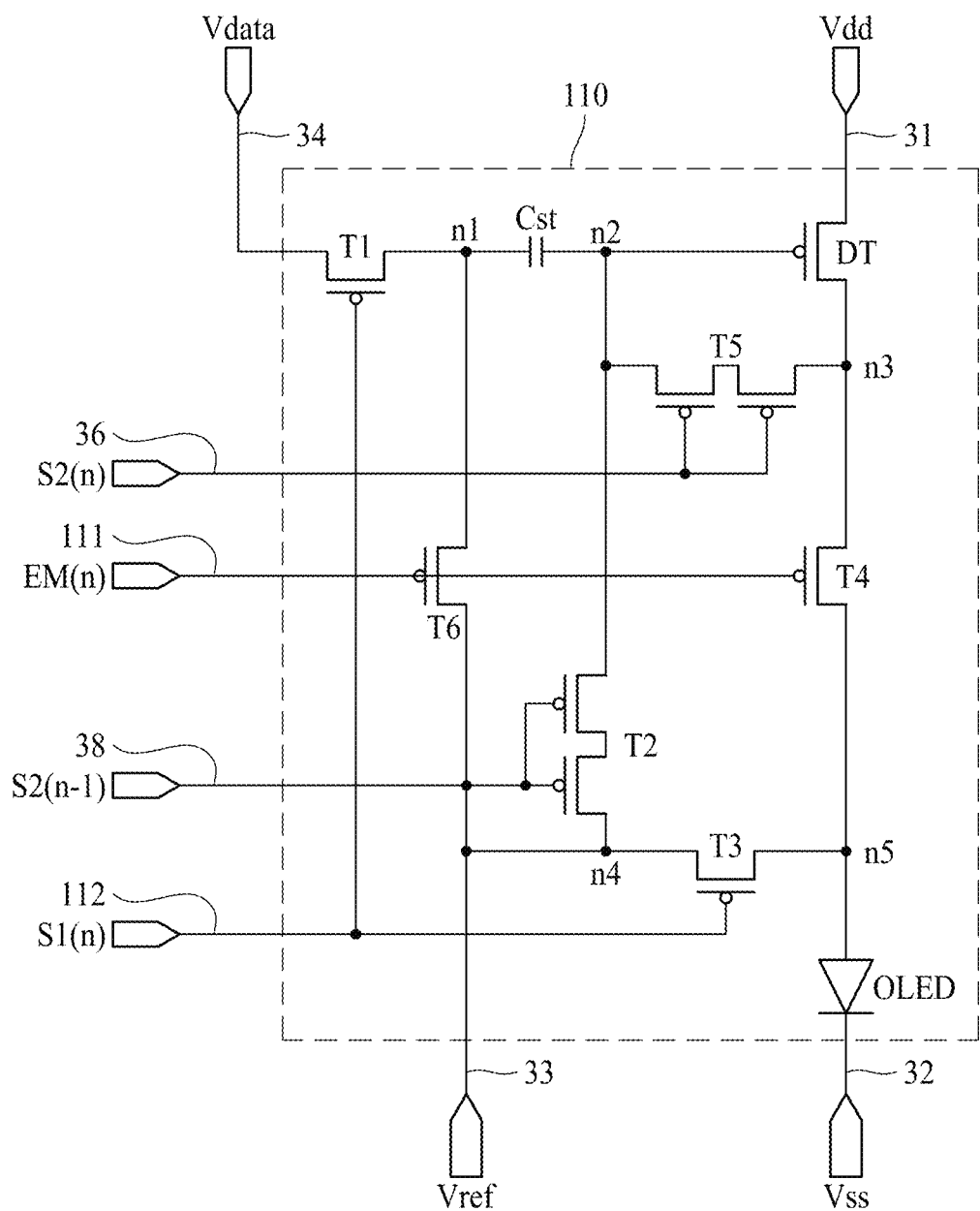
FIG. 11 illustrates another example of a pixel circuit of a display apparatus according to one embodiment of the present disclosure.

FIG. 11 illustrates another example of a pixel circuit of a display apparatus according to one embodiment of the present disclosure.

Referring to FIG. 11, a pixel circuit 110 can include seven thin film transistors TFTs (or transistors), one capacitor, and an emission element OLED. For example, the pixel circuit can include a driving TFT DT, a first TFT T1, a second TFT T2, a third TFT T3, a fourth TFT T4, a fifth TFT T5, a sixth TFT T6, a capacitor Cst, and an emission element OLED.

In the embodiment, the first TFT T1 and the third TFT T3 can be connected to a scan line 112 for providing the first scan signal S1(n) of the (n)th pixel row. For example, a gate electrode of the first TFT T1 and a gate electrode of the third TFT T3 can be connected to the scan line 112 for providing the first scan signal S1(n) of the (n)th pixel row. In this case, the first TFT T1 and the third TFT T3 can be turned-on (or on) or turned-off (or off) by the first scan signal S1(n) of the (n)th pixel row.

For example, the first TFT T1 and the third TFT T3 can be P-type transistors. In this case, the first TFT T1 and the third TFT T3 can be turned-off when the first scan signal S1(n) of the (n)th pixel row is a high-level voltage, and turned-on when the first scan signal S1(n) of the (n)th pixel row is a low-level voltage. The source electrode and the drain electrode can be connected when the first TFT T1 and the third TFT T3 are turned-on. The source electrode and the drain electrode can be blocked (or separated) when the first TFT T1 and the third TFT T3 are turned-off.

In the embodiment, the fourth TFT T4 can be connected to an emission signal line 111 for supplying an emission signal EM(n) of the (n)th pixel row. The fourth TFT T4 can be a P-type transistor. In this case, the fourth TFT T4 can be turned-off when the emission signal EM(n) of the (n)th pixel row is a high-level voltage and turned-on when the emission signal EM (n) of the (n)th pixel row is a low-level voltage. When the fourth TFT T4 is turned-on, the source electrode and the drain electrode can be connected to each other. The source electrode and the drain electrode can be blocked (or separated) when the fourth TFT T4 is turned-off.

The embodiment of FIG. 11 can omit a scan line (for example, fourth scan line 39 of FIG. 3) supplying the first scan signal S1(n−1) of the (n−1)th pixel row and a second emission signal line (for example, second emission signal line 40 of FIG. 3) for supplying an emission signal EM(n−1) of the (n−1)th pixel row, as compared with the embodiment of FIG. 3. In this case, a plan layout of the pixel circuit 110 can also be changed, and the embodiment thereof can be described with reference to FIG. 13.

Figure 12:
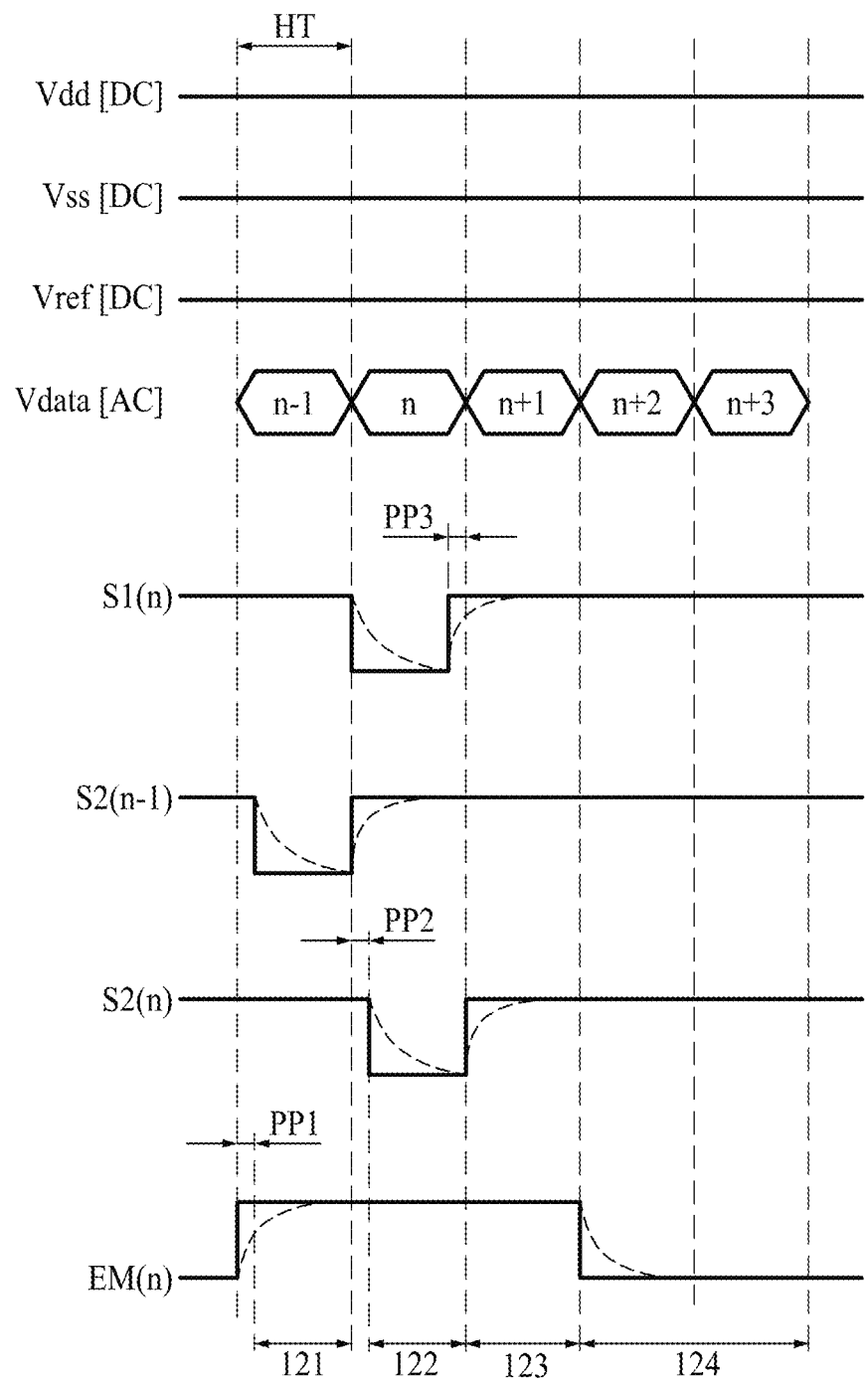
FIG. 12 illustrates the timing of signal related to the pixel circuit of the display apparatus according to the embodiment of FIG. 11.

FIG. 12 illustrates the timing of signal related to the pixel circuit of the display apparatus according to the embodiment of FIG. 11. FIG. 12 illustrates the signal applied to the pixel circuit of FIG. 11 and the driving period of the pixel circuit according to the state of the signal applied.

Referring to FIG. 12, the pixel circuit (for example, the pixel circuit 110 of FIG. 11) can be supplied with a first voltage (or high-potential voltage) Vdd, a second voltage (or low-potential voltage) Vss, a reference voltage Vref, and a data voltage Vdata.

In the embodiment, the driving period of the pixel circuit can include an initial period 121, a sampling period 122, a holding period 123, and an emission period 124.

In the embodiment, in the initial period 121, the second scan signal S2(n−1) of the (n−1)th pixel row can be inputted as a low-level voltage. The first scan signal S1(n) of the (n)th pixel row, the second scan signal S2(n) of the (n)th pixel row, and the emission signal EM(n) of the (n)th pixel row can be input as a high-level voltage.

In the embodiment, a rising time of the emission signal EM(n) of the (n)th pixel row can be advanced by a first time PP1 than a start time of the initial period 121. The first time PP1 can be a predetermined time (or preset time).

In the embodiment, the first scan signal S1(n) of the (n)th pixel row and the second scan signal S2(n) of the (n)th pixel row in the sampling period 122 can be input as a low-level voltage. The second scan signal S2(n−1) of the (n−1)th pixel row and the emission signal EM(n) of the (n)th pixel row can be input as a high-level voltage.

In the embodiment, a start time point of the sampling period 122 can correspond to a period in which the second scan signal S2(n) of the (n)th pixel row is a low-level voltage. A falling time at which the second scan signal S2(n) of the (n)th pixel row is changed from a high-level voltage to a low-level voltage can correspond to a start point of the sampling period 122.

In the embodiment, the falling time of the second scan signal S2(n) of the (n)th pixel row can be delayed by a second time PP2 than the rising time of the second scan signal S2(n) of the (n−1)th pixel row. In this case, it is possible to secure a short (or short circuit) margin between the first voltage Vdd and the reference voltage Vref. For example, the interval of the second time PP2 can be provided between the second scan signal S2(n−1) of the (n−1)th pixel row supplied to the pixel circuit and the second scan signal S2(n) of the (n)th pixel row, thereby preventing the second TFT T2 and the fifth TFT T5 from being turned-on at the same time.

In the embodiment, the first scan signal S1(n) of the (n)th pixel row can maintain the low-voltage level for a predetermined period in the sampling period 122. The first scan signal S1(n) of the (n)th pixel row can be changed to the high-level voltage after a predetermined period elapses. For example, the first scan signal S1(n) of the (n)th pixel row can be changed from the low-level voltage to the high-level voltage before a third time PP3 from the holding period 123 subsequent to the sampling period 122. The second scan signal S2(n) of the (n)th pixel row can be changed from the low-level voltage to the high-level voltage in response to a start point of the holding period 123.

In the embodiment, the first scan signal S1(n) of the (n)th pixel row is changed from the low-level voltage to the high-level voltage before the third time PP3 from the holding period 123 following the sampling period 122, thereby preventing the data voltage Vdata from being mixed in the holding period 123.

In the embodiment, the emission period 124 can be performed after the sampling period 122 and/or the holding period 123. In the emission period 44, the second scan signal S2(n−1) of the (n−1)th pixel row, the first scan signal S1(n) of the (n)th pixel row, and the second scan signal S2(n) of the (n)th pixel row can be input as the high-level voltage. The emission signal EM(n) of the (n)th pixel row can be input as the low-level voltage.

In the embodiment, a solid line pulse of FIG. 12 indicates an example in which a signal is applied, and a dotted line pulse indicates an example in which a delay of a signal is generated in a process of being applied to the pixel circuit. In other words, the first scan signal S1(n), the second scan signal S2(n−1) and S2 (n), and the emission signal EM(n) are provided to the pixel circuit in the gate driving circuit in substantially the same form as the solid line pulse of FIG. 12, however, the delay can be generated in its providing process, whereby the signal can be applied to the pixel circuit in the form of the dotted line pulse. This can be seen as an error range associated with the driving of the pixel circuit, which can be considered to be included in the scope of the embodiments herein. For example, even if the delay occurs while the signal is changed from the low-level voltage to the high-level voltage and the signal appears in the form such as the dotted line, the signal can be included in the scope of the present embodiment.

Figure 13:
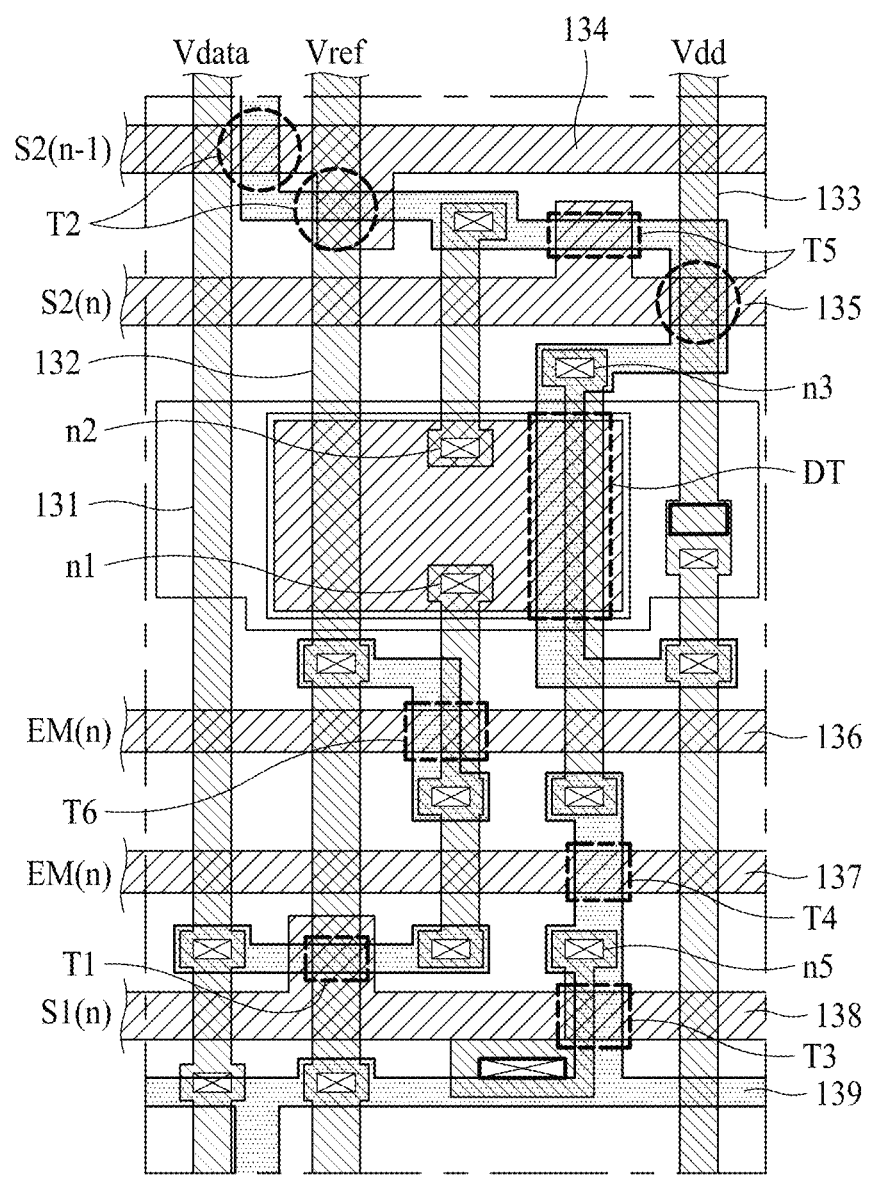
FIG. 13 is a plan view of the pixel circuit of the display apparatus according to one embodiment of FIG. 11.

FIG. 13 is a plan view of the pixel circuit of the display apparatus according to one embodiment of FIG. 11. Hereinafter, the same contents as those of FIG. 6 can be omitted.

Referring to FIG. 13, the pixel circuit can include the data line 131 for supplying the data voltage Vdata, the reference voltage supply line 132 for supplying the reference voltage Vref, and the first voltage supply line 133 for supplying the high-potential voltage.

In the embodiment, the reference voltage supply line 132 can be disposed between the first voltage supply line 133 and the data line 131. A distance between the reference voltage supply line 132 and the first voltage supply line 133 can be greater than a distance between the reference voltage supply line 132 and the data line 131.

In one embodiment, the third TFT T3, the fourth TFT T4, the fifth TFT T5, the sixth TFT T6, and the driving TFT DT can be disposed in a region between the reference voltage supply line 132 and the first voltage supply line 133. According to another embodiment of the present disclosure, the third TFT T3, the fourth TFT T4, the fifth TFT T5, the sixth TFT T6, and the driving TFT DT can be omitted, or the other TFT can be additionally arranged in a region between the reference voltage supply line 132 and the first voltage supply line 133.

The data line 131, the reference voltage supply line 132, and the first voltage supply line 133 can be made of the same as or similar material to the source electrode or drain electrode (first electrode or second electrode) of the TFTs (for example, first TFT T1~sixth TFT T6, and driving TFT DT). In this case, at least a portion of the data line 131, the reference voltage supply line 132, and the first voltage supply line 133 can be disposed on the same layer as at least a portion of the source electrode and/or the drain electrode (first electrode or second electrode) of the TFT. A more specific example related thereto can be referred to in FIG. 14.

In the embodiment, at least some of the emission signal line and the scan line of the pixel circuit can be arranged in parallel with each other. For example, as shown in the drawings, the first scan line 134 for supplying the second scan signal S2(n−1) of the (n−1)th pixel row, the second scan line 135 for supplying the second scan signal S2(n) of the (n)th pixel row, the emission signal line 136 and 137 for supplying the emission signal of the (n)th pixel row, and the first scan line 138 for supplying the first scan signal S1(n) of the (n)th pixel row can be arranged in parallel.

In the embodiment, the emission signal lines 136 and 137 can be the plurality of emission signal lines. In this case, the first emission signal line 136 is connected to the sixth TFT T6 and the second emission signal line 137 can be connected to the fourth TFT T4. Although the first emission signal line 136 and the second emission signal line 137 are separately shown in FIG. 13, at least a portion of the first emission signal line 136 and the second emission signal line 137 can be connected according to the embodiment.

In the embodiment, the emission signal line and the scan line of the pixel circuit can be made of the same material as or similar material to the gate electrode of the TFT (for example, first to sixth TFTs T1 to T6 and driving TFT DT). In this case, at least a portion of the emission signal line and the scan line can be disposed on the same layer as at least a portion of the gate electrode of the TFT. An example related thereto can be referred to in FIG. 14.

In the embodiment, an active layer 139 of the TFT can be disposed in the pixel circuit. At least a portion of the active layer 139 can form an active layer of the plurality of TFTs. For example, a portion of the active layer 139 can be configured by connecting an active layer of the fourth TFT T4 and the third TFT T3. Another portion of the active layer 139, for example, another portion separated from the active layer of the fourth TFT T4 and the third TFT T3, can form an active layer of the second TFT T2 and the fifth TFT T5. However, this is merely an example, and the arrangement of the active layer 139 can be changed according to a design type.

Figure 14:
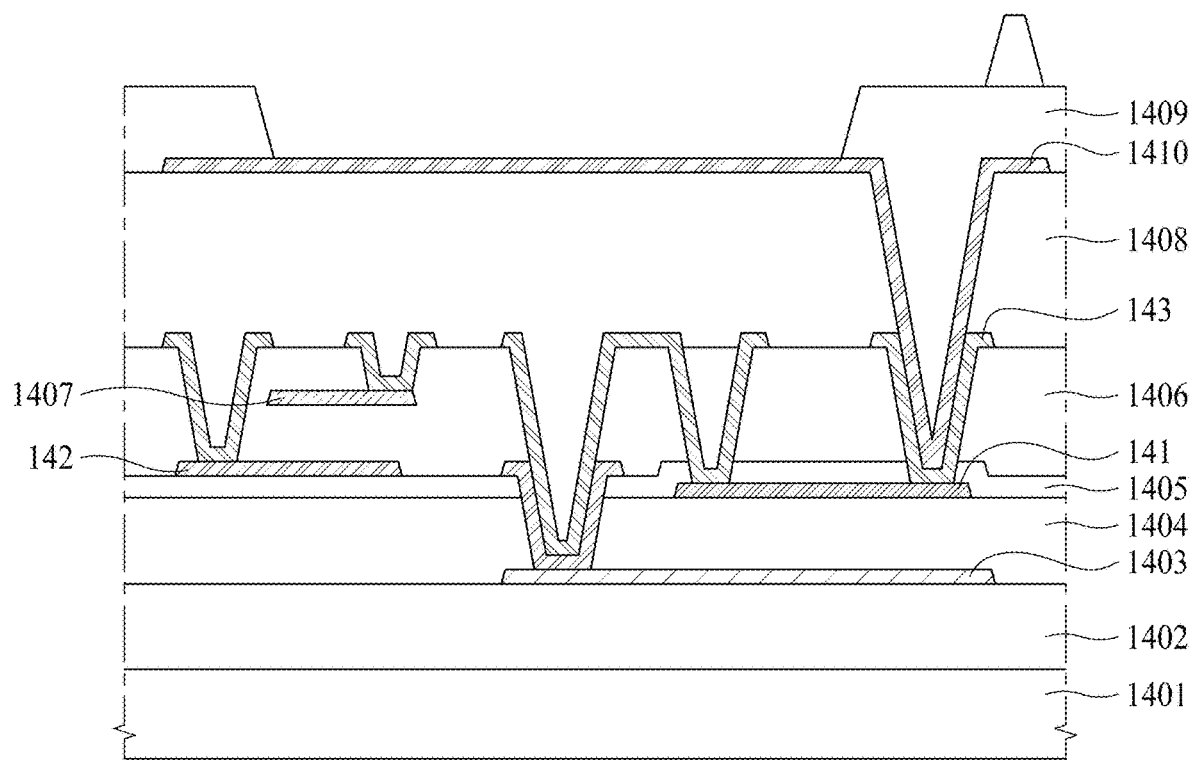
FIG. 14 is a cross-sectional view of the pixel circuit of the display apparatus according to one embodiment of the present disclosure.

FIG. 14 is a cross-sectional view of the pixel circuit of the display apparatus according to one embodiment of the present disclosure. For example, FIG. 14 describes an arrangement of an active layer 141, a gate layer 142, and a source and drain (source/drain) layer 143 in the display apparatus according to the embodiment of the present disclosure.

The cross section shown in FIG. 14 is generally applicable to various embodiments of the present disclosure. For example, the active layer 141, the gate layer 142, and the source/drain layer 143 of each of the pixel circuits according to the embodiment of FIG. 6 and the embodiment of FIG. 13 can be disposed as shown in FIG. 14.

Referring to FIG. 14, a first buffer layer 1402 can be disposed on a first substrate 1401. The first substrate 1401 can be a glass or plastic substrate. When the first substrate 1401 is a plastic substrate, the first substrate 1401 can have flexibility by using polyimide-based or polycarbonate-based materials.

In the embodiment, the first substrate 1401 can include a flexible substrate of which at least a portion has a curved shape. In this case, the pixel circuit according to the embodiment of the present disclosure can be disposed on at least a portion of the first substrate 1401.

The first buffer layer 1402 is formed of an insulating material and can be formed of one or more insulating layers. For example, the first buffer layer 1402 can be formed of one or more inorganic insulating materials. When the first buffer layer 1402 is formed of one or more insulating layers, the first buffer layer 1402 can be a multi-buffer layer, but not limited thereto. A metal layer 1403 can be formed on the first buffer layer 1402, and a second buffer layer 1404 can be formed to cover the metal layer 1403. The second buffer layer 1404 can be formed of an inorganic insulating material, and can be formed of one or more insulating layers, but not limited thereto.

The metal layer 1403 can be patterned by a photolithography process. The metal layer 1403 can include a light shield pattern. The light shield pattern blocks external light to prevent light from being irradiated to the active layer of the TFT, thereby preventing photo current of the TFT formed in a pixel area. When the light shield pattern is formed of metal having a low absorption coefficient of a laser wavelength used in a laser ablation process compared to a metal layer (for example, a cathode) to be removed in a sensing area, the light shield pattern can serve as a shielding layer for blocking a laser beam LB in the laser ablation process.

A gate insulating layer 1405 and the active layer 141 (for example, active layer 615 of FIG. 6, active layer 139 of FIG. 13) can be disposed on the second buffer layer 1404. The gate insulating layer 1405 can be formed of an inorganic insulating material, but not limited thereto.

The gate layer 142 can be formed on the gate insulating layer 1405. The gate layer 142 can be patterned by a photo-lithography process. The gate layer 142 can be used as a pattern for connecting the gate line, the gate electrode in each of the plurality of TFTs T1 T6 and DT, the lower electrode of the storage capacitor, and the metal layer 1403 to the other metal layer such as the pattern of the source/drain layer 143, for example, a jumper pattern.

In the embodiment, the gate layer 142 can form the scan line and the emission signal line. For example, the gate layer 142 can form the scan line for supplying the first scan signal or second scan signal (for example, S1(n), S1(n−1), S2(n), S2(n−1)), and the emission signal line for supplying the emission signal (for example, EM(n−1), EM(n)).

The active layer 141 can be formed of a semiconductor material on the second buffer layer 1404 and can be patterned by a photo-lithography process. The active layer 141 can include the active pattern in each of the TFTs of the pixel circuit and the TFT of the gate driver. A portion of the active layer 141 can be metalized by ion doping. The metalized portion can be used as a jumper pattern for connecting the metal layers at some nodes of the pixel circuit, to thereby connect components of the pixel circuit.

In the embodiment, the active layer 141 can be formed of polysilicon. In this case, a predetermined portion of the active layer 141 can be doped with impurities. The active layer 141 can be made of amorphous silicon a-Si or various organic semiconductor materials such as pentacene. When the active layer 141 is formed of polysilicon, amorphous silicon is formed, and the amorphous silicon is crystallized to be changed into polysilicon. As a crystallization method, various methods such as Lapid Thermal Annealing LTA, Metal Induced Lateral Crystallization MILC, Sequential Lateral Solidification SLS, etc. can be applied, but not limited thereto. According to the embodiment, the active layer 141 can be made of oxide.

An insulating layer 1406 can be disposed on or around the gate insulating layer 1405 and the gate layer 142. In the embodiment, the gate insulating layer 1405 can be formed of an insulating material, such as silicon oxide layer SiOx or silicon nitride layer, or can be formed of an organic insulating material, but not limited thereto. A gate electrode 104 can be formed of various conductive materials such as Mg, Al, Ni, Cr, Mo, W, MoW, Au, or alloy thereof, but not limited thereto. An insulating interlayer 1406 for covering the gate layer 142 can be disposed on the gate insulating layer 1405. An additional metal layer 1407 can be disposed on the insulating interlayer 1406. For example, when the insulating interlayer 1406 includes a plurality of insulating layers, the additional metal layer 1407 can be disposed on some insulating layers. The additional metal layer 1407 can be patterned by a photo-lithography process. The additional metal layer 1407 can include metal patterns such as an upper electrode of a storage capacitor (eg, capacitor Cst of FIG. 3).

A source/drain layer 143 can be disposed on the insulating interlayer 1406. The source/drain layer 143 can be formed to penetrate at least a portion of the second buffer layer 1404, the insulating interlayer 1406, and the gate insulating layer 1405. For example, the source/drain layer 143 can be disposed to pass through a contact hole passing through at least a portion of the second buffer layer 1404, the gate insulating layer 1405, and the insulating interlayer 1406. In this case, the source/drain layer 143 can be connected to at least a portion of another layer disposed under the second buffer layer 1404, the insulating layer 1406, or the gate insulating layer 1405, for example, at least a portion of the gate layer 142.

In the embodiment, the source/drain layer 143 can form the data line for supplying the data voltage Vdata, the reference voltage supply line for supplying the reference voltage Vref, and the first voltage supply line for supplying the high-potential voltage.

A planarization layer 1408 for covering the source/drain layer 143 can be disposed on the source/drain layer 143. A bank layer 1409 and an anode electrode 1410 can be disposed on the planarization layer 1408. The planarization layer 1408 can include an organic insulating material for planarizing a surface, but not limited thereto. According to the embodiment, the planarization layer 1408 can include a plurality of planarization layers, but not limited thereto.

In the embodiment, the bank layer 1409 can include a bank and/or a spacer. The anode electrode 1410 can be an electrode constituting the emission element (for example, emission element OLED of FIG. 3). At least a portion of the anode electrode 1410 can be disposed at the lower end of the bank layer 1409. At least a portion of the anode electrode and the bank layer 1409 can be disposed to pass through a contact hole (reference numeral) passing through at least a portion of the planarization layer 1408, the insulating interlayer 1406, and the gate insulating layer 1405.

An emission layer EL and a cathode electrode can be disposed on the anode electrode 1410. The emission element can collectively refer to the anode electrode 1410, the emission layer, and the cathode electrode. However, according to the embodiment, some elements can be additionally included, or some elements can be removed, but not limited thereto.

The gate layer, the active layer, and the source/drain layer of the pixel circuit according to the embodiment of the present disclosure can be arranged as shown in FIG. 14, but not limited thereto. However, the arrangement relationships can be changed according to embodiments.

Figure 15:
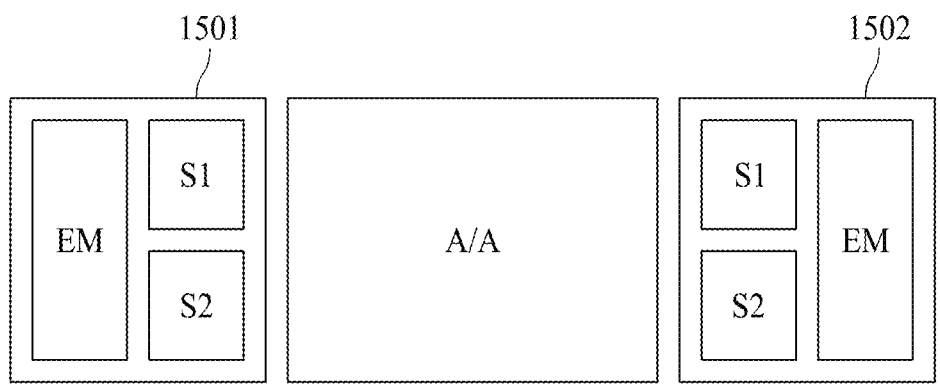
FIG. 15 illustrates an example of a gate driving circuit included in the display apparatus according to one embodiment of the present disclosure.

FIG. 15 illustrates an example of the gate driving circuit included in the display apparatus according to the embodiment of the present disclosure. For example, FIG. 15 describes a case where the gate driving circuit is symmetrically arranged.

Referring to FIG. 15, the gate driving circuit can be formed on at least one side of an active area AA formed in a display panel (eg, display panel 10 of FIG. 1). The gate driving circuit is connected to the active area AA and is configured to provide a signal for driving the display panel to the active area AA.

According to the embodiment of the present disclosure, the gate driving circuit can be configured to include two areas and can be respectively arranged on one side and the other side of the active area AA. For example, a first area 1501 of the gate driving circuits can be disposed on the left side of the active area AA, and a second area 1502 can be disposed on the right side of the active area AA. According to another embodiment of the present disclosure, when the active area is formed in a circular shape (or oval, polygonal, amorphous shape), the first area 1501 is arranged to be adjacent to at least a portion of the edge of the active area AA, and the second area 1502 is arranged to be adjacent to at least another portion of the edge of the active area AA.

In the embodiment, the first area 1501 and the second area 1502 included in the gate drive circuit can be symmetrical.

For example, each of the first area 1501 and the second area 1502 of the gate driving circuit can include an emission signal stage EM for driving each pixel row, a first scan signal stage S1, and a second scan signal stage S2. The emission signal stage EM can provide the emission signal (for example, EM(n)) to the pixel circuit. The first scan signal stage S1 can provide the first scan signal (for example, S1(n), S1(n−1)) to the pixel circuit. The second scan signal stage S2 can provide the second scan signal (for example, S2(n), S2(n−1)) to the pixel circuit.

Each stage can be arranged such that the first area 1501 and the second area 1502 are symmetrical with each other with an active area AA interposed therebetween. In this case, the gate driving circuit can simultaneously provide the signal for driving the pixel to one pixel circuit in each of the first area 1501 and the second area 1502. The signal providing method effectively reduces the time required for signal transmission, thereby enabling pixel driving to be quickly performed.

In the embodiment, the width of each of the first area 1501 and the second area 1502 of the gate driving circuit can be 350 μm to 450 μm. However, this is merely an example, and embodiments of the present disclosure are not limited thereto.

According to the embodiment, the first area 1501 can be a first gate driving circuit, and the second area 1502 can be a second gate driving circuit, but embodiments of the present disclosure are not limited to these terms. In addition, other components not shown in the drawings can be further included in each area of the gate driving circuit. For example, when a third scan signal is provided to the pixel circuit, a third scan signal stage for providing the third scan signal can be further included, and the third scan signal stage can be arranged to be symmetrical to each of the first area 1501 and the second area 1502.

Figure 16:
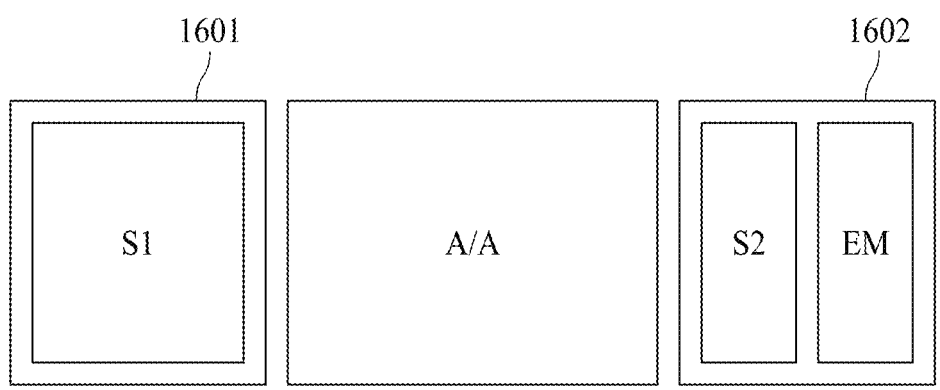
FIG. 16 illustrates another example of a gate driving circuit included in the display apparatus according to one embodiment of the present disclosure.

FIG. 16 illustrates another example of the gate driving circuit included in the display apparatus according to the embodiment of the present disclosure. For example, FIG. 16 describes a case in which the gate driving circuit is asymmetrically arranged. Hereinafter, descriptions for the substantially same contents as those of FIG. 15 can be omitted or simplified.

Referring to FIG. 16, the gate driving circuit can be divided into a first area 1601 and a second area 1602 to be disposed on at least two sides (or both sides) of the active area AA. For example, the first area 1601 can be disposed on the left side of the active area AA, and the second area 1602 can be disposed on the right side of the active area AA. According to another embodiment of the present disclosure, when the active area is formed in a circular shape (or oval, polygonal, amorphous shape), the first area 1601 is arranged to be adjacent to at least a portion of the edge of the active area AA, and the second area 1602 is arranged to be adjacent to at least another portion of the edge of the active area AA.

In the embodiment, the first area 1601 and a second area 1602 included in the gate driving circuit can comprise different configurations. For example, as shown in the drawings, the first area 1601 comprises a first scan signal stage S1, and the second area 1602 comprises an emission signal stage EM and a second scan signal stage S2. In another example, the first area 1601 includes a second scan signal stage S2, and the second area 1602 includes an emission signal stage EM and a first scan signal stage S1.

According to the embodiment, the gate driving circuit can further include a configuration for providing a specific signal to the pixel circuit (hereinafter, specific signal stage). In this case, the specific signal stage can be implemented to be included in at least one of the first area 1601 and the second area 1602. For example, the specific signal stage can be implemented to be included in the first area 1601. For another example, the specific signal stage can be divided into two and implemented to be included in each of the first area 1601 and the second area 1602. In this case, the specific signal stage included in each of the first area 1601 and the second area 1602 can be symmetrical.

In the pixel circuit and the display apparatus according to some embodiments of the present disclosure, since the switching transistor is disposed between the gate node of the driving transistor and the reference voltage applying node, the driving failure of the pixel circuit can be reduced and the display quality can be improved by changing the current flow path of the initialization period.

In addition, the pixel circuit and the display apparatus according to some embodiments of the present disclosure can improve the operation efficiency of the pixel circuit by dispersing the load of the gate signal.

The pixel circuit according to the embodiment of the present disclosure and the display apparatus comprising the same can be described as follows.

According to some embodiment of the present disclosure, a pixel circuit can include a capacitor connected between a first node and a second node, a first transistor connected between a data line and the first node, a driving transistor including a gate electrode connected to the second node, a first electrode connected to a first voltage supply line, and a second electrode connected to a third node, a second transistor connected between the second node and a fourth node, the fourth node being connected to a reference voltage supply line, a third transistor connected between the fourth node and a fifth node, and an emission element connected to the driving transistor and connected to the third transistor through the fifth node.

According to some embodiment of the present disclosure, the first transistor can be connected to a first scan line supplying a (n)th first scan signal, where n is a natural number, the second transistor can be connected to a third scan line supplying a (n−1)th second scan signal, and the third transistor can be connected to a fourth scan line supplying a (n−1)th first scan signal. The fourth scan line can be further connected to a first transistor included in a pixel circuit of a (n−1)th pixel row.

According to some embodiment of the present disclosure, the pixel circuit can further include a fourth transistor connected between the third node and the fifth node, and a fifth transistor connected between the second node and the third node.

According to some embodiment of the present disclosure, the fourth transistor can be applied with a (n−1)th emission signal of the (n−1)th pixel row. The fifth transistor can be connected to a second scan line supplying a (n)th second scan signal. One side of the emission element can be connected to the third transistor and the fourth transistor, and the other side of the emission element can be connected to a second voltage supply line. A first voltage (for example, the first voltage Vdd of FIG. 3) supplied through the first voltage supply line can be higher than a second voltage (for example, the second voltage Vss of FIG. 3) supplied through the second voltage supply line. The second voltage can be a ground voltage.

According to some embodiment of the present disclosure, at least one of the fifth transistor and the second transistor can include two gates.

According to some embodiment of the present disclosure, the pixel circuit can be operated to include an initialization period, a sampling period, and an emission period, and the reference voltage can be applied to the second node through the second transistor in the initialization period. The pixel circuit can further include a sixth transistor connected between the first node and the reference voltage supply line, the sixth transistor being applied with a (n)th emission signal from a first emission signal line. In the initialization period, the reference voltage can be applied to the first node through the sixth transistor and be applied to the fifth node through the third transistor.

According to some embodiment of the present disclosure, the first transistor and the third transistor can be connected to a first scan line supplying a (n)th first scan signal, where n is a natural number, and the second transistor can be connected to a third scan line supplying a (n−1) second scan signal.

According to some embodiment of the present disclosure, the a pixel circuit can further include a fourth transistor connected between the third node and the fifth node, a fifth transistor connected between the second node and the third node, and a sixth transistor connected between the first node and the reference voltage supply line. The fourth transistor and the sixth transistor can be applied with a (n)th emission signal from an emission signal line, and the fifth transistor can be applied with a (n)th second scan signal from a second scan line.

According to some embodiment of the present disclosure, at least one of the first transistor, the second transistor, the third transistor, and the driving transistor can include an oxide transistor.

A display apparatus including a pixel circuit according to some embodiment of the pixel circuit can include a capacitor connected between a first node and a second node, a first transistor connected to a data line and the first node, a driving transistor including a gate electrode connected to the second node, a first electrode connected to a first voltage supply line, and a second electrode connected to a third node, a second transistor connected between the second node and a fourth node, a third transistor connected between the fourth node and a fifth node, the fourth node being connected to a reference voltage supply line, a fourth transistor connected between the third node and the fifth node, a fifth transistor connected between the second node and the third node, a sixth transistor connected between the first node and the reference voltage supply line, and an emission element connected between a fifth node and a second voltage supply line.

According to some embodiment of the present disclosure, the first transistor can be applied with a (n)th first scan signal from a first scan line, where n is a natural number, the second transistor can be applied with a (n−1)th second scan signal from a third scan line, the third transistor can be applied with a (n−1)th first scan signal from a fourth scan line, the fourth transistor can be applied with a (n−1)th emission signal from a second emission signal line, the fifth transistor can be applied with a (n)th second scan signal from a second scan line, and a sixth transistor can be applied with a (n)th emission signal from a first emission signal line.

According to some embodiment of the present disclosure, the pixel circuit can operate to include an initialization period, a sampling period, and an emission period, and the reference voltage can be applied to the second node through the second transistor in the initialization period.

According to some embodiment of the present disclosure, the first transistor and the third transistor can be applied with a (n)th first scan signal from a first scan line, where n is a natural number, the second transistor can be applied with a (n−1)th second scan signal from a third scan line, the fourth transistor and the sixth transistor can be applied with a (n)th emission signal from an emission signal line, and the fifth transistor can be applied with a (n)th second scan signal from a second scan line.

According to some embodiment of the present disclosure, the display apparatus can further include a flexible substrate having at least a portion with a curved shape, a first driving circuit configured to control switching of the first to sixth transistors and a second driving circuit configured to supply a first voltage to the driving transistor through the first voltage supply line and supply a second voltage to the emission element through the second voltage supply line.

It will be apparent to those skilled in the art that various modifications and variations can be made in the pixel circuit and the display apparatus comprising the pixel circuit of the present disclosure without departing from the technical idea or scope of the disclosure. Thus, it is intended that the present disclosure cover the modifications and variations of this disclosure provided they come within the scope of the appended claims and their equivalents.

What is claimed is:
1. A pixel circuit comprising:
a capacitor connected between a first node and a second node;
a first transistor connected between a data line and the first node;
a driving transistor including a gate electrode connected to the second node, a first electrode connected to a first voltage supply line, and a second electrode connected to a third node;
a second transistor connected between the second node and a fourth node, the fourth node being connected to a reference voltage supply line;
a third transistor connected between the fourth node and a fifth node;
a fourth transistor connected between the third node and the fifth node;

a fifth transistor connected between the second node and the third node; and an emission element connected to the driving transistor and connected to the third transistor through the fifth node, wherein a first scan signal for being applied with the first transistor is different from a second scan signal for being applied with the fifth transistor, and wherein a turn-on period of the fifth transistor is longer than a turn-on period of the first transistor.

2. The pixel circuit according to claim 1, wherein:
the first transistor is connected to a first scan line supplying a (n)th first scan signal, where n is a natural number;
the second transistor is connected to a third scan line supplying a (n−1)th second scan signal; and
the third transistor is connected to a fourth scan line supplying a (n−1)th first scan signal,
wherein the fourth scan line is further connected to a first transistor included in a pixel circuit of a (n−1)th pixel row.

3. The pixel circuit according to claim 2,
wherein the fourth transistor is for being applied with a (n−1)th emission signal of the (n−1)th pixel row, where n is a natural number, and
wherein the fifth transistor is connected to a second scan line supplying a (n)th second scan signal.

4. The pixel circuit according to claim 3, wherein one side of the emission element is connected to the third transistor and the fourth transistor, and the other side of the emission element is connected to a second voltage supply line.

5. The pixel circuit according to claim 4, wherein a first voltage for being supplied through the first voltage supply line is higher than a second voltage for being supplied through the second voltage supply line.

6. The pixel circuit according to claim 5, wherein the second voltage is a ground voltage.

7. The pixel circuit according to claim 1, wherein at least one of the fifth transistor and the second transistor includes two gates.

8. The pixel circuit according to claim 1,
wherein the pixel circuit is configured to be operated to include an initialization period, a sampling period, and an emission period, and
wherein a reference voltage is for being applied to the second node through the second transistor in the initialization period.

9. The pixel circuit according to claim 8, further comprising a sixth transistor connected between the first node and the reference voltage supply line, the sixth transistor for being applied with a (n)th emission signal from a first emission signal line.

10. The pixel circuit according to claim 9, wherein, in the initialization period, the reference voltage is applied to the first node through the sixth transistor and is applied to the fifth node through the third transistor.

11. The pixel circuit according to claim 1, wherein:
the first transistor and the third transistor are connected to a first scan line supplying a (n)th first scan signal, where n is a natural number; and
the second transistor is connected to a third scan line supplying a (n−1) second scan signal.

12. The pixel circuit according to claim 11, further comprising:
a sixth transistor connected between the first node and the reference voltage supply line, wherein the fourth transistor and the sixth transistor are for being applied with a (n)th emission signal from an emission signal line, and wherein the fifth transistor is for being applied with a (n)th second scan signal from a second scan line.

13. The pixel circuit according to claim 1, wherein at least one of the first transistor, the second transistor, the third transistor, and the driving transistor includes an oxide transistor.

14. A display apparatus including a pixel circuit, wherein the pixel circuit comprises:
a capacitor connected between a first node and a second node;
a first transistor connected to a data line and the first node;
a driving transistor including a gate electrode connected to the second node, a first electrode connected to a first voltage supply line, and a second electrode connected to a third node;
a second transistor connected between the second node and a fourth node;
a third transistor connected between the fourth node and a fifth node, the fourth node being connected to a reference voltage supply line;
a fourth transistor connected between the third node and the fifth node;
a fifth transistor connected between the second node and the third node;
a sixth transistor connected between the first node and the reference voltage supply line; and
an emission element connected between the fifth node and a second voltage supply line,
wherein:
a first scan signal for being applied with the first transistor is different from a second scan signal for being applied with the fifth transistor;
the fourth transistor is for being applied with a (n−1)th emission signal from a second emission signal line;
the sixth transistor is for being applied with a (n)th emission signal from a first emission signal line; and
a turn-off time of the sixth transistor is delayed than a turn-off time of the fourth transistor.

15. The display apparatus according to claim 14, wherein:
the first transistor is for being applied with a (n)th first scan signal from a first scan line, where n is a natural number;
the second transistor is for being applied with a (n−1)th second scan signal from a third scan line;
the third transistor is for being applied with a (n−1)th first scan signal from a fourth scan line; and
the fifth transistor is for being applied with a (n)th second scan signal from a second scan line.

16. The display apparatus according to claim 15,
wherein the (n)th first scan signal for being applied with the first transistor is different from the (n−1)th first scan signal for being applied with the third transistor.

17. The display apparatus according to claim 14, wherein the pixel circuit is configured to operate to include an initialization period, a sampling period, and an emission period, and
wherein a reference voltage is for being applied to the second node through the second transistor in the initialization period.

18. The display apparatus according to claim 14,
wherein a turn-on period of the fifth transistor is longer than a turn-on period of the first transistor.

19. The display apparatus according to claim 14, further comprising:
- a flexible substrate having at least a portion with a curved shape;
- a first driving circuit configured to control switching of the first to sixth transistors; and
- a second driving circuit configured to supply a first voltage to the driving transistor through the first voltage supply line and supply a second voltage to the emission element through the second voltage supply line.

20. The display apparatus according to claim 14,
- wherein a second pulse width of the second scan signal is larger than a first pulse width of the first scan signal.

\* \* \* \* \*